United States Patent
Liao et al.

(10) Patent No.: US 11,569,865 B1
(45) Date of Patent: Jan. 31, 2023

(54) RECONFIGURABLE BASEBAND FILTER

(71) Applicant: QUALCOMM Incorporated, San Diego, CA (US)

(72) Inventors: Chih-Fan Liao, San Diego, CA (US); Aleksandar Miodrag Tasic, San Diego, CA (US); Kyle David Holland, San Diego, CA (US); Jang Joon Lee, San Diego, CA (US); Jian Kang, San Diego, CA (US); Lai Kan Leung, San Marcos, CA (US); Chiewcharn Narathong, Laguna Niguel, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/448,872

(22) Filed: Sep. 24, 2021

(51) Int. Cl.
*H04B 1/525* (2015.01)
(52) U.S. Cl.
CPC .................................. *H04B 1/525* (2013.01)
(58) Field of Classification Search
CPC . H04B 1/40; H04B 1/44; H04B 1/525; H03H 11/28
See application file for complete search history.

(56) References Cited

U.S. PATENT DOCUMENTS

| | | | |
|---|---|---|---|
| 2016/0373125 A1* | 12/2016 | Pagnanelli | H03M 3/436 |
| 2020/0313625 A1* | 10/2020 | Wimmer | H03F 1/56 |
| 2022/0131563 A1* | 4/2022 | Sayed | H04B 1/0483 |
| 2022/0173761 A1* | 6/2022 | Nabki | G16H 10/60 |
| 2022/0190852 A1* | 6/2022 | Summerfield | H04B 1/0475 |
| 2022/0209805 A1* | 6/2022 | Yu | H04B 1/0007 |
| 2022/0255897 A1* | 8/2022 | Miele | G06N 3/02 |

* cited by examiner

*Primary Examiner* — Thanh C Le
(74) *Attorney, Agent, or Firm* — Qualcomm/Norton Rose Fulbright US LLP

(57) ABSTRACT

Wireless signal processing may be improved by using a configurable baseband filter (BBF) in the receive path of a transceiver. A configurable BBF may accommodate processing of different wireless signals in a single integrated circuit (IC) chip. For example, a single IC may support processing of 5G mmWave RF signals and 5G sub-7 GHz RF signals by reconfiguring the BBF with settings appropriate for the different wireless signals. The reconfiguring of the BBF may include adjusting a bandwidth of the BBF and/or adjusting a filter order of the BBF. The reconfiguring of the BBF may be performed in response to detection of jammer signals to improve rejection of the jammer signals.

32 Claims, 11 Drawing Sheets

RECONFIGURABLE BASEBAND FILTER

FIELD OF THE DISCLOSURE

Aspects of the present disclosure relate generally to wireless communication systems, and more particularly, to radio frequency (RF) signal processing for wireless communication systems. Some features may enable and provide improved communications, including improved baseband processing components.

BACKGROUND

Wireless communication networks are widely deployed to provide various communication services such as voice, video, packet data, messaging, broadcast, and the like. These wireless networks may be multiple-access networks capable of supporting multiple users by sharing the available network resources. Such networks may be multiple access networks that support communications for multiple users by sharing the available network resources.

A wireless communication network may include several components. These components may include wireless communication devices, such as base stations (or node Bs) that may support communication for a number of user equipments (UEs). A UE may communicate with a base station via downlink and uplink. The downlink (or forward link) refers to the communication link from the base station to the UE, and the uplink (or reverse link) refers to the communication link from the UE to the base station.

A base station may transmit data and control information on a downlink to a UE or may receive data and control information on an uplink from the UE. On the downlink, a transmission from the base station may encounter interference due to transmissions from neighbor base stations or from other wireless radio frequency (RF) transmitters. On the uplink, a transmission from the UE may encounter interference from uplink transmissions of other UEs communicating with the neighbor base stations or from other wireless RF transmitters. This interference may degrade performance on both the downlink and uplink.

As the demand for mobile broadband access continues to increase, the possibilities of interference and congested networks grows with more UEs accessing the long-range wireless communication networks and more short-range wireless systems being deployed in communities. Research and development continue to advance wireless technologies not only to meet the growing demand for mobile broadband access, but to advance and enhance the user experience with mobile communications.

Signals in a wireless network are received at a UE over an antenna and downconverted from the RF signal received at the antenna to a baseband signal at approximately zero hertz. The baseband signal is then processed and decoded to obtain information embedded in the wireless signal that was received at the antenna. Processing of the baseband signal may include filtering the baseband signal to eliminate undesired frequencies in the baseband signal. FIG. 1 shows one conventional signal processing path with a baseband filter. Circuit 100 includes an amplifier 102 coupled to a mixer 104. The output of the mixer 104 is a bandpass signal that is filtered through pairs 106A and 106B of inductors (L) and capacitors (C), referred to as a LC filter. LC filters have shortcomings that make them undesirable for wireless communications in certain circumstances. For example, LC filters may have limited configurability because the inductor (L) may be difficult to tune. Thus, the bandwidth of the baseband filter may have limited range, resulting in processing with an analog-to-digital converter (e.g., coupled to an output of 106B) at a higher sampling rate that increases power consumption. Power consumption in wireless networks reduces mobile device usability and cost of operating base stations. Further, a passive filter, such as the LC filters shown in pairs 106A and 106B, may lose a portion of the signal strength and is not able to provide gain.

Shortcomings mentioned here are only representative and are included to highlight problems that the inventors have identified with respect to existing devices and sought to improve upon. Aspects of devices described below may address some or all of the shortcomings as well as others known in the art. Aspects of the improved devices described below may present other benefits than, and be used in other applications than, those described above.

BRIEF SUMMARY OF SOME EXAMPLES

Wireless signal processing may be improved by using a configurable baseband filter (BBF) in the receive path of a transceiver. The configurable filter (BBF) may allow configuring the BBF to better accommodate different wireless signals, to improve the likelihood of recovering the data embedded in the transmitted signal, and/or to reduce power consumption. A configurable BBF may accommodate processing of different wireless signals in a single integrated circuit (IC) chip. For example, a single IC may support processing of 5G mmWave RF signals and 5G sub-7 GHz RF signals by reconfiguring the BBF with settings appropriate for the different wireless signals. The reconfiguring of the BBF may include adjusting a bandwidth of the BBF and/or adjusting a filter order of the BBF.

The reconfiguring of the BBF may also or alternatively accommodate different components in the baseband processing circuitry. For example, different analog-to-digital converters (ADC) have different characteristics with different input signal requirements. The BBF may be reconfigured to filter the baseband signal to obtain a signal appropriate for the ADC operating in the baseband processing. Supporting multiple ADCs within the baseband processing is useful for using a single IC for processing multiple wireless communications systems, and particularly when the wireless communications systems have signals with different characteristics. For example, 5G mmWave signals and 5G sub-7 GHz signals may both be used in a 5G communications system but may use different baseband processing components tuned to the disparate frequencies used for 5G mmWave signals and 5G sub-7 GHz signals. The BBF may be configured based on whether 5G mmWave signals or 5G sub-7 GHz signals are being processed in the baseband circuitry.

The configurable BBF may alternatively or additionally be adjusted to better reject jammer signals. A jammer signal is an undesired signal component that may be much higher in amplitude than a desired signal component and may be located close in frequency to the desired signal component. Jammer signals may exist, for example, when multiple wireless communication systems co-exist. In one example, the coexistence may be between long and short range wireless communication systems, such as with 5G signals coexisting with Wi-Fi signals. In another example, the coexistence may be between two long range wireless communication systems operating in a similar frequency band, such as with 5G signals coexisting with 4G signals. In a further example, the coexistence may be between two radio access technologies (RATs) even when the RF signals for the RATs are separated in frequency space, such as 5G mmWave signals coexisting with 5G sub-7 GHz signals. In the 5G mmWave example, the 5G mmWave IF signals, downconverted from mmWave RF signals, may overlap in frequency space with the 5G sub-7 GHz signals and/or be located at harmonics of the 5G sub-7 GHz signals. The coexistence of these signals on the same or nearby transmission paths (e.g., located in proximity to each other or more generally in the same integrated circuit or on the same substrate) may create spurs in the signal paths for the sub-7 GHz and mmWave IF signals. Jammer signals may also exist, for example, with co-existence of signals from the same communication system on different carriers, such as 5G signals on one carrier coexisting with 5G signals on another carrier. Issues with jammer signals may further increase when the communication system supports carrier aggregation, in which devices transmit related information on multiple carriers simultaneously, sometimes over different communications systems. Issues with jammer signals may also be increased when different RF signals are processed on the same integrated circuit (IC). Detection of these jammer signals may be used to reconfigure the BBF to reject these jammer signals and improve the likelihood of retrieving the information embedded in the signals. When no jammer signal is detected and/or a jammer signal is below a threshold signal level, a bandwidth of the BBF may be increased. When a jammer signal is detected and/or a jammer signal is above a threshold signal level, a bandwidth of the BBF may be decreased to increase rejection of the jammer signal. In one embodiment, switching a BBF 3 dB bandwidth from 240 MHz to a smaller 200 MHz results in improved rejection at adjacent channel selection (ACS) by 7 dB.

In one aspect of the disclosure, an apparatus includes an input port for receiving a baseband (BB) input signal; a configurable BB filter coupled to the input port; logic circuitry coupled to the configurable BB filter, wherein the logic circuitry is configured to perform steps comprising: evaluating one or more criteria relating to the BB input signal; and/or configuring the configurable BB filter based, at least in part, on the evaluating of the one or more criteria.

In one aspect of the disclosure, a method includes evaluating one or more criteria relating to a BB input signal to a configurable BB filter; and/or configuring the configurable BB filter based, at least in part, on evaluating the one or more criteria.

In an additional aspect of the disclosure, an apparatus is disclosed that includes at least one processor, and a memory coupled to the at least one processor. The at least one processor is configured to perform any of the methods or techniques described herein. For example, the at least one processor may be configured to perform steps including evaluating one or more criteria relating to a BB input signal to a configurable BB filter; and/or configuring the configurable BB filter based, at least in part, on evaluating the one or more criteria.

In an additional aspect of the disclosure, a non-transitory computer-readable medium stores instructions that, when executed by a processor, cause the processor to perform operations including those described in the method and techniques described herein. For example, the operations may include evaluating one or more criteria relating to a BB input signal to a configurable BB filter; and/or configuring the configurable BB filter based, at least in part, on evaluating the one or more criteria.

Other aspects, features, and implementations will become apparent to those of ordinary skill in the art, upon reviewing the following description of specific, exemplary aspects in conjunction with the accompanying figures. While features may be discussed relative to certain aspects and figures below, various aspects may include one or more of the advantageous features discussed herein. In other words, while one or more aspects may be discussed as having certain advantageous features, one or more of such features may also be used in accordance with the various aspects. In similar fashion, while exemplary aspects may be discussed below as device, system, or method aspects, the exemplary aspects may be implemented in various devices, systems, and methods.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Like reference numbers and designations in the various drawings indicate like elements.

DETAILED DESCRIPTION

Figure 1:
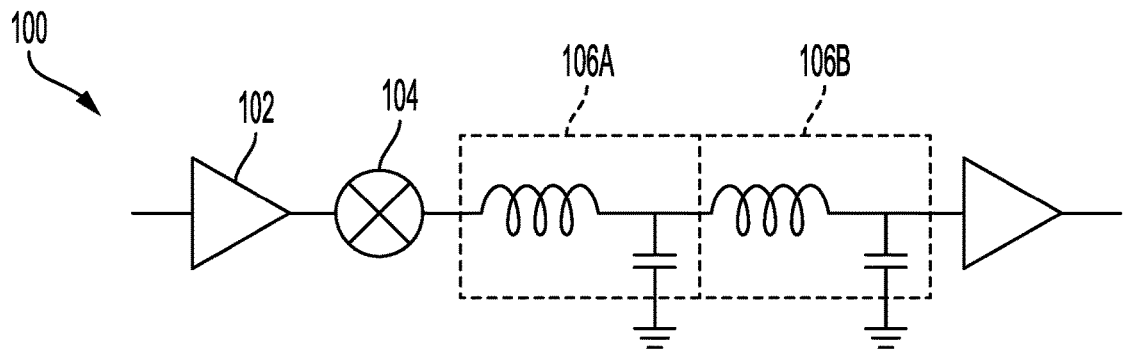
FIG. 1 is a circuit schematic illustrating a conventional baseband filter.

The detailed description set forth below, in connection with the appended drawings, is intended as a description of various configurations and is not intended to limit the scope of the disclosure. Rather, the detailed description includes specific details for the purpose of providing a thorough understanding of the inventive subject matter. It will be apparent to those skilled in the art that these specific details are not required in every case and that, in some instances, well-known structures and components are shown in block diagram form for clarity of presentation.

This disclosure relates generally to providing or participating in communications (e.g., authorized shared access) between two or more wireless devices in one or more wireless communications systems, also referred to as wireless communications networks. In various implementations, the techniques and apparatus may be used for wireless communication networks such as code division multiple access (CDMA) networks, time division multiple access (TDMA) networks, frequency division multiple access (FDMA) networks, orthogonal FDMA (OFDMA) networks, single-carrier FDMA (SC-FDMA) networks, LTE networks, GSM networks, 5$^{th}$ Generation (5G) or new radio (NR) networks (sometimes referred to as "5G NR" networks, systems, or devices), as well as other communications networks. As described herein, the terms "networks" and "systems" may be used interchangeably.

A CDMA network, for example, may implement a radio technology such as universal terrestrial radio access (UTRA), cdma2000, and the like. UTRA includes wideband-CDMA (W-CDMA) and low chip rate (LCR). CDMA2000 covers IS-2000, IS-95, and IS-856 standards.

A TDMA network may, for example implement a radio technology such as Global System for Mobile Communication (GSM). The 3rd Generation Partnership Project (3GPP) defines standards for the GSM EDGE (enhanced data rates for GSM evolution) radio access network (RAN), also denoted as GERAN. GERAN is the radio component of GSM/EDGE, together with the network that joins the base stations (for example, the Ater and Abis interfaces) and the base station controllers (A interfaces, etc.). The radio access network represents a component of a GSM network, through which phone calls and packet data are routed from and to the public switched telephone network (PSTN) and Internet to and from subscriber handsets, also known as user terminals or user equipments (UEs). A mobile phone operator's network may comprise one or more GERANs, which may be coupled with UTRANs in the case of a UMTS/GSM network. Additionally, an operator network may also include one or more LTE networks, or one or more other networks. The various different network types may use different radio access technologies (RATs) and RANs.

An OFDMA network may implement a radio technology such as evolved UTRA (E-UTRA), Institute of Electrical and Electronics Engineers (IEEE) 802.11, IEEE 802.16, IEEE 802.20, flash-OFDM and the like. UTRA, E-UTRA, and GSM are part of universal mobile telecommunication system (UMTS). In particular, long term evolution (LTE) is a release of UMTS that uses E-UTRA. UTRA, E-UTRA, GSM, UMTS and LTE are described in documents provided from an organization named "3rd Generation Partnership Project" (3GPP), and cdma2000 is described in documents from an organization named "3rd Generation Partnership Project 2" (3GPP2). These various radio technologies and standards are known or are being developed. For example, the 3GPP is a collaboration between groups of telecommunications associations that aims to define a globally applicable third generation (3G) mobile phone specification. 3GPP LTE is a 3GPP project which was aimed at improving UMTS mobile phone standard. The 3GPP may define specifications for the next generation of mobile networks, mobile systems, and mobile devices. The present disclosure may describe certain aspects with reference to LTE, 4G, or 5G NR technologies; however, the description is not intended to be limited to a specific technology or application, and one or more aspects described with reference to one technology may be understood to be applicable to another technology. Additionally, one or more aspects of the present disclosure may be related to shared access to wireless spectrum between networks using different radio access technologies or radio air interfaces.

5G networks contemplate diverse deployments, diverse spectrum, and diverse services and devices that may be implemented using an OFDM-based unified, air interface. To achieve these goals, further enhancements to LTE and LTE-A are considered in addition to development of the new radio technology for 5G NR networks. The 5G NR will be capable of scaling to provide coverage (1) to a massive Internet of things (IoTs) with an ultra-high density (e.g., ~1 M nodes/km$^2$), ultra-low complexity (e.g., ~10 s of bits/sec), ultra-low energy (e.g., ~10+years of battery life), and deep coverage with the capability to reach challenging locations; (2) including mission-critical control with strong security to safeguard sensitive personal, financial, or classified information, ultra-high reliability (e.g., ~99.9999% reliability), ultra-low latency (e.g., ~1 millisecond (ms)), and users with wide ranges of mobility or lack thereof; and (3) with enhanced mobile broadband including extreme high capacity (e.g., ~10 Tbps/km$^2$), extreme data rates (e.g., multi-Gbps rate, 100+Mbps user experienced rates), and deep awareness with advanced discovery and optimizations.

Devices, networks, and systems may be configured to communicate via one or more portions of the electromagnetic spectrum. The electromagnetic spectrum is often subdivided, based on frequency or wavelength, into various classes, bands, channels, etc. In 5G NR two initial operating bands have been identified as frequency range designations FR1 (410 MHz —7.125 GHz) and FR2 (24.25 GHz-52.6 GHz). The frequencies between FR1 and FR2 are often referred to as mid-band frequencies. Although a portion of FR1 is greater than 6 GHz, FR1 is often referred to (interchangeably) as a "sub-6 GHz" band in various documents and articles, and will be referred to herein as "sub-7 GHz". A similar nomenclature issue sometimes occurs with regard to FR2, which is often referred to (interchangeably) as a "millimeter wave" (mmWave) band in documents and articles, despite including frequencies outside of the extremely high frequency (EHF) band (30 GHz-300 GHz) which is identified by the International Telecommunications Union (ITU) as a "mmWave" band.

With the above aspects in mind, unless specifically stated otherwise, it should be understood that the term "sub-7 GHz" or the like if used herein may broadly represent frequencies that may be less than 7 GHz, may be within FR1, or may include mid-band frequencies. Further, unless specifically stated otherwise, it should be understood that the term "mmWave" or the like if used herein may broadly represent frequencies that may include mid-band frequencies, may be within FR2, or may be within the EHF band.

5G NR devices, networks, and systems may be implemented to use optimized OFDM-based waveform features. These features may include scalable numerology and transmission time intervals (TTIs); a common, flexible framework to efficiently multiplex services and features with a dynamic, low-latency time division duplex (TDD) design or frequency division duplex (FDD) design; and advanced wireless technologies, such as massive multiple input, multiple output (MIMO), robust mmWave transmissions, advanced channel coding, and device-centric mobility. Scalability of the numerology in 5G NR, with scaling of sub-carrier spacing, may efficiently address operating diverse services across diverse spectrum and diverse deployments. For example, in various outdoor and macro coverage deployments of less than 3 GHz FDD or TDD implementations, subcarrier spacing may occur with 15 kHz, for example over 1, 5, 10, 20 MHz, and the like bandwidth. For other various outdoor and small cell coverage deployments of TDD greater than 3 GHz, subcarrier spacing may occur with 30 kHz over 80/100 MHz bandwidth. For other various indoor wideband implementations, using a TDD over the unlicensed portion of the 5 GHz band, the subcarrier spacing may occur with 60 kHz over a 160 MHz bandwidth. Finally, for various deployments transmitting with mmWave components at a TDD of 28 GHz, subcarrier spacing may occur with 120 kHz over a 500 MHz bandwidth.

The scalable numerology of 5G NR facilitates scalable TTI for diverse latency and quality of service (QoS) requirements. For example, shorter TTI may be used for low latency and high reliability, while longer TTI may be used for higher spectral efficiency. The efficient multiplexing of long and short TTIs to allow transmissions to start on symbol boundaries. 5G NR also contemplates a self-contained integrated subframe design with uplink or downlink scheduling information, data, and acknowledgement in the same subframe. The self-contained integrated subframe supports communications in unlicensed or contention-based shared spectrum, adaptive uplink or downlink that may be flexibly configured on a per-cell basis to dynamically switch between uplink and downlink to meet the current traffic needs.

For clarity, certain aspects of the apparatus and techniques may be described below with reference to example 5G NR implementations or in a 5G-centric way, and 5G terminology may be used as illustrative examples in portions of the description below; however, the description is not intended to be limited to 5G applications.

Moreover, it should be understood that, in operation, wireless communication networks adapted according to the concepts herein may operate with any combination of licensed or unlicensed spectrum depending on loading and availability. Accordingly, it will be apparent to a person having ordinary skill in the art that the systems, apparatus and methods described herein may be applied to other communications systems and applications than the particular examples provided.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, implementations or uses may come about via integrated chip implementations or other non-module-component based devices (e.g., end-user devices, vehicles, communication devices, computing devices, industrial equipment, retail device or purchasing devices, medical devices, AI-enabled devices, etc.). While some examples may or may not be specifically directed to use cases or applications, a wide assortment of applicability of described innovations may occur. Implementations may range from chip-level or modular components to non-modular, non-chip-level implementations and further to aggregated, distributed, or original equipment manufacturer (OEM) devices or systems incorporating one or more described aspects. In some practical settings, devices incorporating described aspects and features may also necessarily include additional components and features for implementation and practice of claimed and described aspects. It is intended that innovations described herein may be practiced in a wide variety of implementations, including both large devices or small devices, chip-level components, multi-component systems (e.g., radio frequency (RF)-chain, communication interface, processor), distributed arrangements, end-user devices, etc. of varying sizes, shapes, and constitution.

Figure 2:
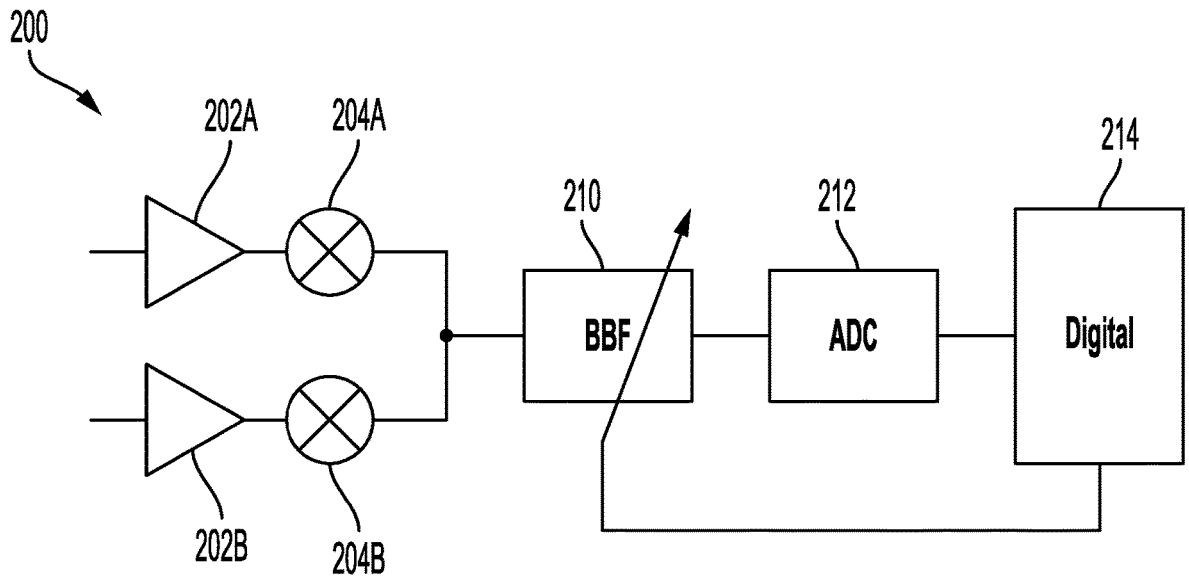
FIG. 2 is a block diagram illustrating a receive path for a wireless signal with a configurable baseband filter (BBF) according to one or more aspects.
Figure 4A:
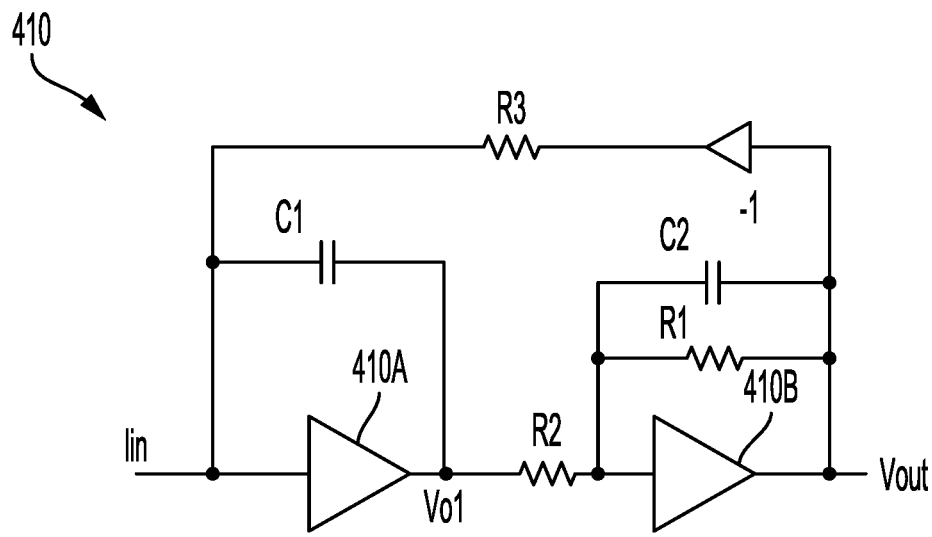
FIG. 4A is a circuit schematic illustrating one configuration of the configurable baseband filter (BBF) of FIG. 3 as a second-order baseband filter according to one or more aspects.

In some implementations, a single integrated circuit (IC) chip may be configured to support multiple disparate wireless network communications systems, such as a single IC chip for supporting 5G mmWave signals and 5G sub-7 GHz signals. Support for multiple wireless network communications systems may be provided for by a configurable baseband filter (BBF), although the configurable BBF may be useful in other implementations involving multiple IC chips or other communications systems. FIG. 2 is a block diagram illustrating a receive path for a wireless signal with a configurable baseband filter (BBF) according to one or more aspects. A receive path circuit 200 may include amplifiers 202A and 202B that receive and amplify RF signals received from an antenna. The circuit 200 may also include mixers 204A and 204B coupled to the amplifiers 202A and 202B, respectively. The mixers 204A and 204B may be configured to convert different frequencies corresponding to different carriers or convert the I-channel and Q-channel of a quadrature coded signal. Additional amplifiers or mixers may be present to support additional functionality. The output of the mixers 204A and 204B is a baseband signal, which may be processed in baseband processing circuitry including a configurable baseband filter (BBF) 210 and an analog-to-digital converter (ADC) 212. In some embodiments, one or more of the amplifiers in the configurable BBF 210 may be configured as a Tow-Thomas Biquad amplifier, such as shown in the configuration of FIG. 4A below. The output of the ADC 212 is a digital signal for processing in digital circuitry 214.

The digital circuitry 214 may control the configurable BBF 210 through one or more control signals to the BBF 210. The configurable BBF 210 may be configurable, for example, to different orders of filter, such as first, second, third, fourth, fifth, sixth, or higher orders, according to the requirements in different operating modes on potential communications systems. The configurable BBF 210 may be configurable, for example, to different filter bandwidths according to the requirements in different operating modes on potential communications systems. For example, the BBF 210 may be configurable to a bandwidth between 5 MHz to 100 MHz for processing a baseband signal from a 5G sub-7 GHz signal and may be configurable to bandwidth between 50 MHz to 400 MHz for processing a baseband signal from a 5G mmWave signal.

The digital circuitry 214 may determine how to configure the configurable BBF 210 by evaluating one or more criteria. The one or more criteria may include rules regarding the presence, strength, and/or frequency of jammer signals. For example, logic circuitry in digital circuitry 214 may determine the presence of j ammers using jammer detection (JDET) modules coupled to the digital circuitry 214, including a JDET in a radio-frequency front end (RFFE) coupled to the transceiver, such as through transmission lines coupling an RFFE IC, a transceiver IC, and other components. The transceiver may include the baseband processing circuitry described herein, a narrowband energy estimator (NBEE), and/or a wide-band energy estimator (WBEE). In some embodiments, jammer detection methods may include computing a delta between NBEE and WBEE, a delta between WBEE in narrow bandwidth mode and wide bandwidth mode, a JDET in a RFFE or a transceiver, and/or SNR-based detection. A narrowband energy estimator (NBEE) may estimate an energy in a narrow signal band, which may be energy located in a first range of frequencies. A wideband energy estimator (WBEE) may estimate an energy in a wide signal band, which may be energy located in a second range or frequencies, in which the first range is a smaller range than the second range. The WBEE may have several modes of operation corresponding to supported bandwidths for estimating energy. For example, the WBEE can support multiple size ranges including the second range as a narrow bandwidth mode and a third range having a larger range than the second range as a wide bandwidth mode. As another example, such logic circuitry may determine the signal strength of potential jammer signals and compare the strength to a threshold level to determine whether to reconfigure the BBF 210. The threshold level for comparing potential jammer signals may be based on a signal strength of a desirable signal. As a further example, the logic circuitry may determine the location of jammer signals relative to desirable signals, and in some embodiments the location of jammer signals may be weighted by the signal strength of the jammer signals. The BBF 210 may be reconfigured by the logic circuitry based on one or more rules criteria involving jammer detection. When no jammer is present according to the rules, the BBF 210 bandwidth may be increased. When a jammer is present according to the rules, BBF 210 bandwidth may be lowered to increase the rejection on jammer.

Different jammer situations that may be detected based on one or more of these criteria include no jammer (in which higher residual side band (RSB) is allowed, BBF order is set low, and BBF bandwidth is set high), in-gap 3GPP jammer (in which lower RSB is allowed for symmetrical bandwidths and higher RSB is allowed for asymmetrical bandwidths, BBF order is set low, and BBF bandwidth is set low), close-in out-of-gap 3GPP jammer (in which lower RSB is allowed, BBF order is set high, and BBF bandwidth is set low), and far-out 3GPP jammer (in which lower RSB is allowed, BBF order is set high, and BBF bandwidth is set high). For example, the allowed RSB may be one of several values (e.g., a first value and a second value), with the one value (e.g., the first) being higher than the other (e.g., the second). Similarly, the order may be one of a number of different values (e.g., one to five, with low being an order of one, two, or optionally three in some examples, and high being an order of five, four, or optionally three in some examples), and the bandwidth may be one of a number of different values or within a range, where a first, low value, represents a value within a lower half of the range and a second, high value, represents a value within an upper half of the range. Jammer detection may also control other aspects, such as activation or deactivation of a high-pass filter and/or triple-invertor-gyrator (TIG) notch in the reconfigurable BBF 210. In some embodiments, the TIG notch may be enabled when signal strength in different bandwidths is greater than a threshold level, such as by determining whether a ratio of a sum of signal strength in notch band 1 (NB1), notch band 2 (NB2), notch band 3 (NB3), and notch band 4 (NB4) to a sum of one component carrier (e.g., a carrier CC1 at an edge of the spectrum of NB1) and one component carrier (e.g., a carrier CC2 at an edge of the spectrum of NB4 opposite CC1) is greater than a threshold (x dB) as expressed in the equation: (NB1+NB2+NB3+NB4)/(CC1NB+CC2 NB)>x dB. In some embodiments, the TIG notch may be disabled when signal strength in different bandwidths is less than a threshold level, such as by determining whether (NB1+NB2+NB3+NB4)/(CC1 NB+CC2 NB)<x-hysteresis dB. An example of various conditions that may be used to determine the jammer situation present in the wireless communication system is shown in the following table for a no jammer scenario, an in-gap jammer scenario (e.g., in which the jammer signal is within the transmission frequency band), and an out-of-gap jammer scenario (e.g., in which the jammer signal is outside of the transmission frequency band):

| Criteria | No Jammer | In-gap 3GPP Jammer | Out-of-gap 3GPP Jammer | |
|---|---|---|---|---|
| | | | Close-in | Far-out |
| Edge Droop | Small | Small | Small | Small |
| SNR | High | Low | Low | Low |
| RSB | High | Low for symmetrical BW High for asymmetrical BW | Low | Low |
| NBEE | Low | Low | Low | Low |
| WBEE | Low | High | High | Dependent |

-continued

| Criteria | No Jammer | In-gap 3GPP Jammer | Out-of-gap 3GPP Jammer | |
|---|---|---|---|---|
| | | | Close-in | Far-out |
| RFFE JDET | Low | High | High | on offset High |
| RFFE JDET-WBEE | Small | Small | Higher than In-gap Jammer | Higher |

Figure 3:
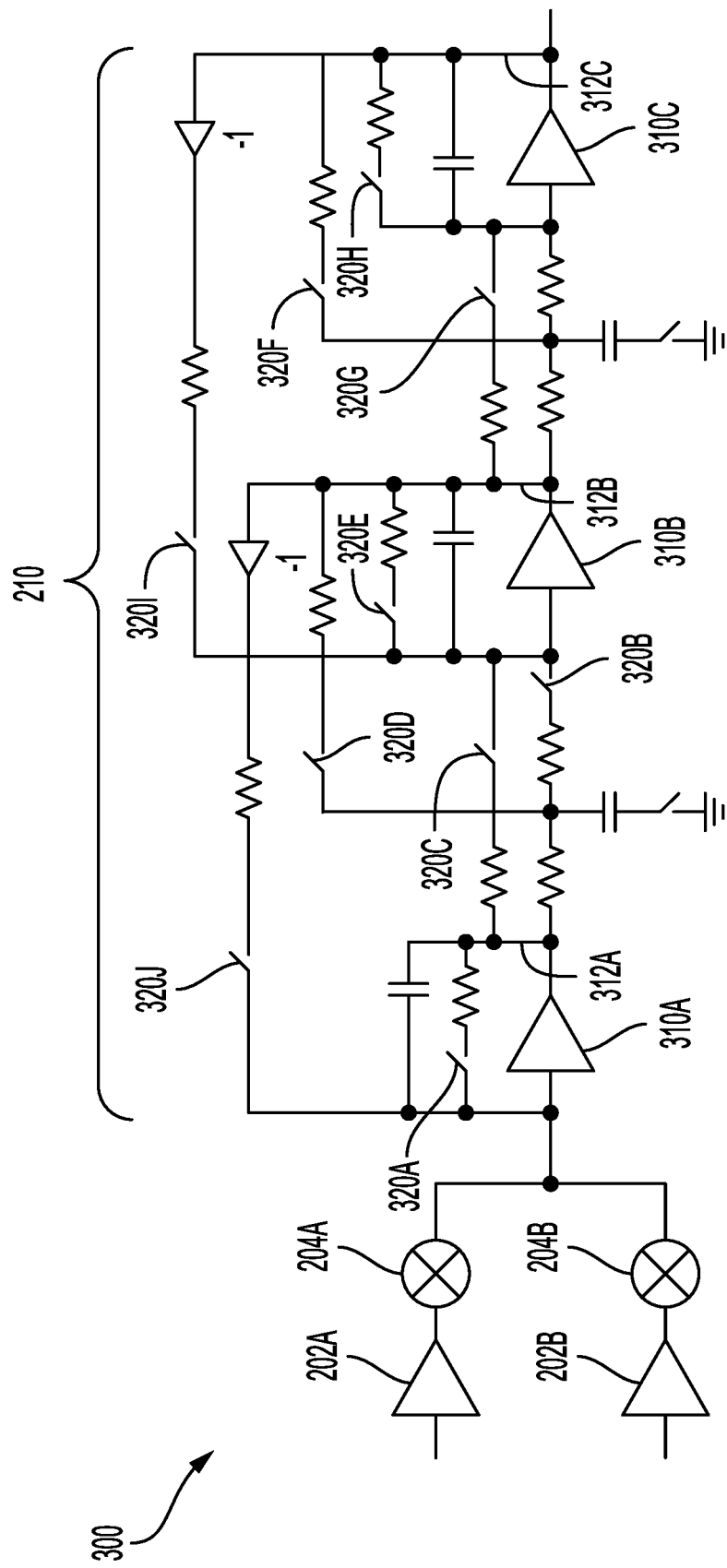
FIG. 3 is a circuit schematic illustrating a configurable baseband filter (BBF) according to one or more aspects.

One example configurable BBF 210 may include combinations of operational amplifiers and feedback loops. The feedback loops may couple an output of each of the operational amplifiers to an input of the operational amplifier or to an input of a previous operational amplifier in a chain. In some embodiments, the feedback loops may include resistors and/or capacitors, but other components may be included. For example, inverting amplifiers may be included. Switches may be coupled through the BBF 210 to allow changing connections in the BBF 210 to reconfigure the BBF 210 for different bandwidth, different filter order, or other changes. One example of a configurable BBF 210 is shown in FIG. 3. FIG. 3 is a circuit schematic illustrating a configurable baseband filter (BBF) according to one or more aspects. A circuit 300 includes amplifiers 202A and 202B coupled to respective mixers 204A and 204B. The amplifiers 202A and 202B may process different portions of wireless signals from the same or different communications systems. The BBF 210 may include operational amplifiers 310A, 310B, and 310C. Each of the operational amplifiers 310A, 310B, and 310C may be coupled to a feedback loop 312A, 312B, and 312C, respectively. Switches 320A-J are coupled at various points within the BBF 210. Some switches are coupled in the feedback loops 312A, 312B, and 312C. Additionally, some switches, such as 320I and 320J are coupled between operational amplifiers 310A, 310B, and 310C. The opamp-RC BBF 210 may be configurable to different orders of filter and different BW modes, reduce power, particularly in lower-bandwidth modes, and/or provide higher gain to meet the gain and linearity requirement of a 5G mmWave transceiver. Respective switches (not illustrated) may be coupled around each of the amplifiers 310 (and in some embodiments around resistors coupled to the inputs or outputs thereof) so as to allow any of the amplifiers 310 to be bypassed. Further, respective selectable paths (not illustrated) may be coupled to outputs of the amplifiers 310A and 310B to allow the respective output to be coupled to an output of the BBF 210 without passing through subsequent components (e.g., resistors, amplifiers) in the BBF 210.

When switches 320A-J are toggled in particular configurations, the BBF 210 may effectively operate as one of the configurations of FIG. 4A, FIG. 4B, FIG. 4C, FIG. 4D, and FIG. 4E. FIG. 4A is a circuit 410 schematic illustrating one configuration of the configurable baseband filter (BBF) of FIG. 3 as a second-order baseband filter according to one or more aspects. In FIG. 4A, a capacitor Cl is coupled in a feedback loop around a first amplifier 410A. A second feedback loop around a second amplifier 410B includes capacitor C2 and R1 coupled in parallel. The first amplifier 410A may be coupled to the second amplifier 410B through a resistor R2. Feedback from the output of the second amplifier 410B (Vout) may be input through an inverter and a resistor R3 back to the input (Vin) of the first amplifier 410A. The configuration of FIG. 4A may be obtained from the circuit of FIG. 3 by opening switches 320A, 320J, 320B, 320F, 320G, 320H, 320I, 320D and closing switches 320C, 320E, 320J of FIG. 3, and bypassing amplifier 310C and the resistors coupled to the input of amplifier 310C (e.g., coupling an output of amplifier 310B to the output of the filter). Other configurations in which amplifier 310A or 310B are bypassed are possible, and the recited configuration is an example only.

Figure 4B:
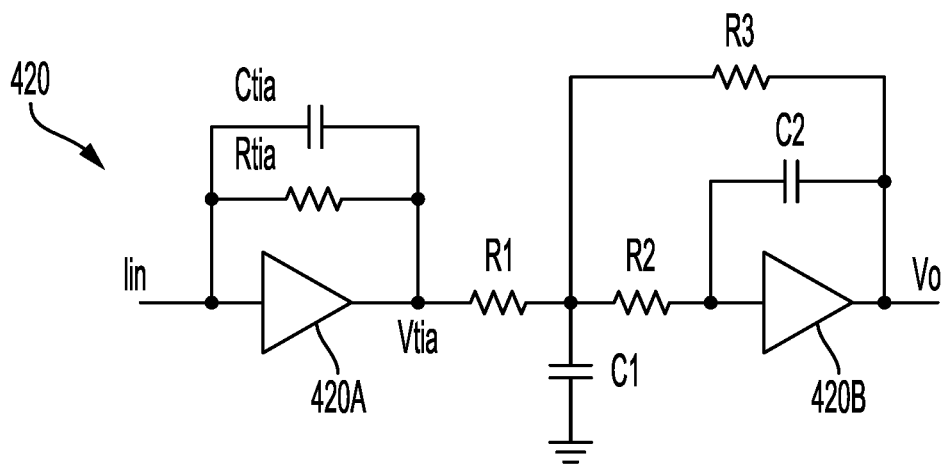
FIG. 4B is a circuit schematic illustrating one configuration of the configurable baseband filter (BBF) of FIG. 3 as a third-order baseband filter according to one or more aspects.

FIG. 4B is a circuit 420 schematic illustrating one configuration of the configurable baseband filter (BBF) of FIG. 3 as a third-order baseband filter according to one or more aspects. In FIG. 4B, a capacitor Ctia and a resistor Rtia are couple din parallel in a feedback loop around a first amplifier 420A. The first amplifier 410A is coupled to a second amplifier 410B through resistances R1 and R2. A feedback path around the second amplifier 410B may include a capacitor C2. A feedback path from the output (Vo) of second amplifier 420B may be coupled through a resistance R3 to a node between the resistances R1 and R2, which is also coupled to a negative power supply (e.g., gnd) through a capacitance C1. The configuration of FIG. 4B may be obtained from the circuit of FIG. 3 by opening switches 320J, 320C, 320E, 320I, 320F, 320G, 320H and closing switches 320A, 320D, 320B of FIG. 3, and bypassing amplifier 310C and the resistors coupled to the input of amplifier 310C (e.g., coupling an output of amplifier 310B to the output of the filter). Alternatively, amplifier 310B may be bypassed and the amplifier 310C and elements coupled thereto can be used as the second stage of the filter.

Figure 4C:
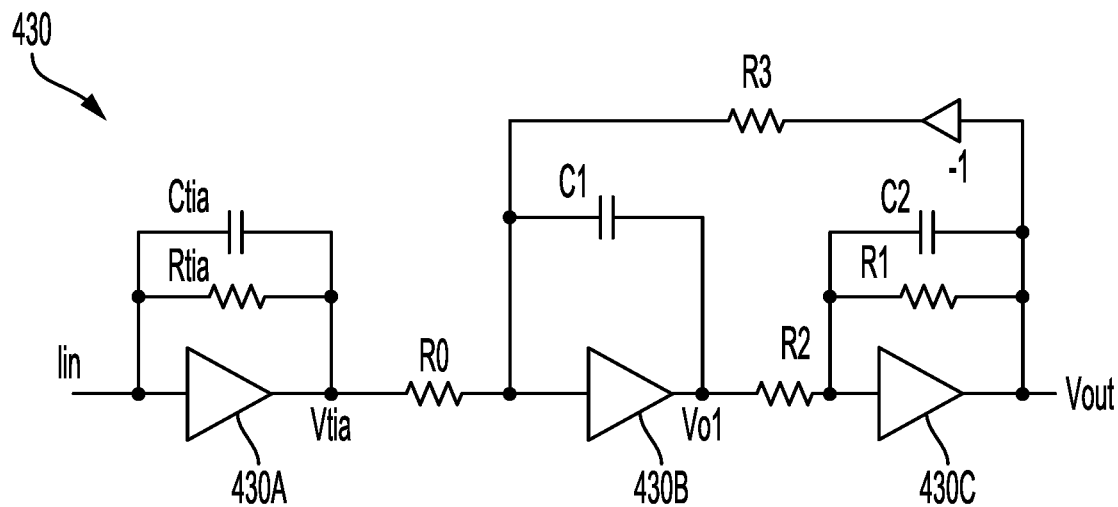
FIG. 4C is a circuit schematic illustrating another configuration of the configurable baseband filter (BBF) of FIG. 3 as a third-order baseband filter according to one or more aspects.

FIG. 4C is a circuit 430 schematic illustrating another configuration of the configurable baseband filter (BBF) of FIG. 3 as a third-order baseband filter according to one or more aspects. In FIG. 4C, a first amplifier 440A is coupled to a second amplifier 440B through a resistance R2. A feedback path around first amplifier 440A may include a capacitance C1. A feedback path around second amplifier 440B may include a capacitance C2 coupled in parallel with a resistance R1. A feedback path from the output of second amplifier 440B to the input (Iin) of the first amplifier 440A may include a resistance R3 and an inverter. A third amplifier 430C is coupled to the second amplifier 430B through resistance R2. A feedback path around third amplifier 430C may include a capacitance C2 in parallel with a resistance R1. A feedback path from an output (Vout) of third amplifier 430C to an input of second amplifier 430B may include an inverter and a resistance R3. The configuration of FIG. 4C may be obtained from the circuit of FIG. 3 by opening switches 320J, 320B, 320D, 320E, 320G, 320F and closing switches 320A, 320C, 320H, 320I of FIG. 3. Other switch configurations may be possible.

Figure 4D:
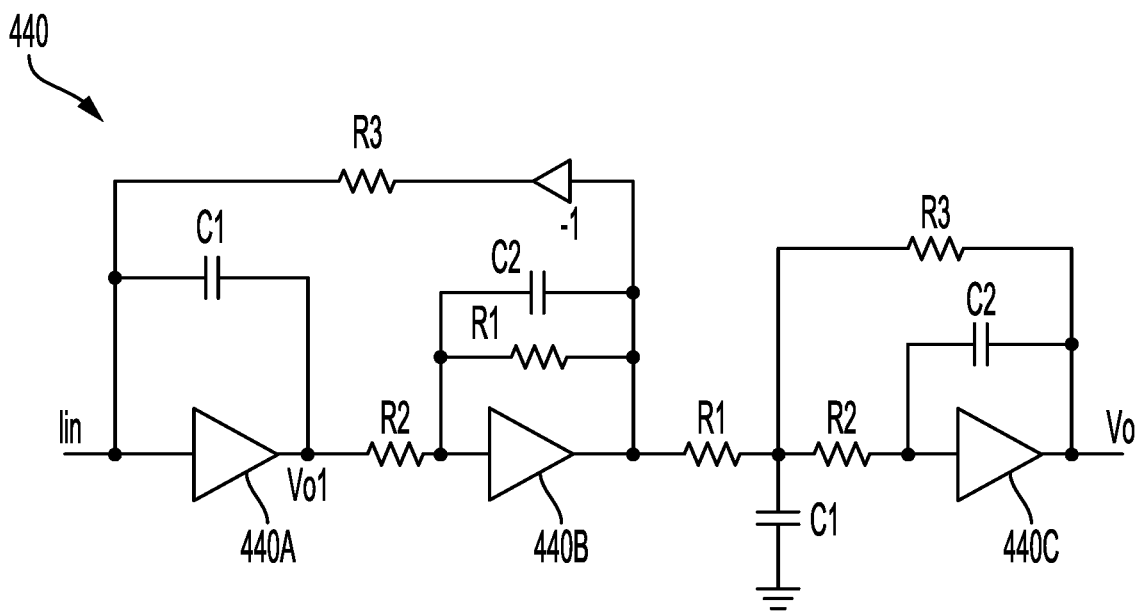
FIG. 4D is a circuit schematic illustrating one configuration of the configurable baseband filter (BBF) of FIG. 3 as a fourth-order baseband filter according to one or more aspects.

FIG. 4D is a circuit 440 schematic illustrating one configuration of the configurable baseband filter (BBF) of FIG. 3 as a fourth-order baseband filter according to one or more aspects. In FIG. 4D, A first amplifier 440A is coupled to a second amplifier 440B through a resistance R2. A feedback path around the first amplifier 440A may include a capacitance Cl. A feedback path around the amplifier 440B may include a resistance R1 in parallel with a capacitance C2. A feedback path from the output of the second amplifier 440B to the input (Iin) of the first amplifier 440A may include an inverter and a resistance R3. A third amplifier 440C may be coupled to the second amplifier 440B through resistances R1 and R2. A feedback around the third amplifier 440C may include a capacitance C2. A feedback path from the output (Vo) of the third amplifier 440C to a node between the resistances R1 and R2 may include a resistance R3, which is also coupled to a negative power supply (e.g., gnd) through a capacitance C1. The configuration of FIG. 4D may be obtained from the circuit of FIG. 3 by opening switches 320A, 320B, 320D, 320G, 320I, 320H and closing switches 320C, 320E, 320J, 320F of FIG. 3.

Figure 4E:
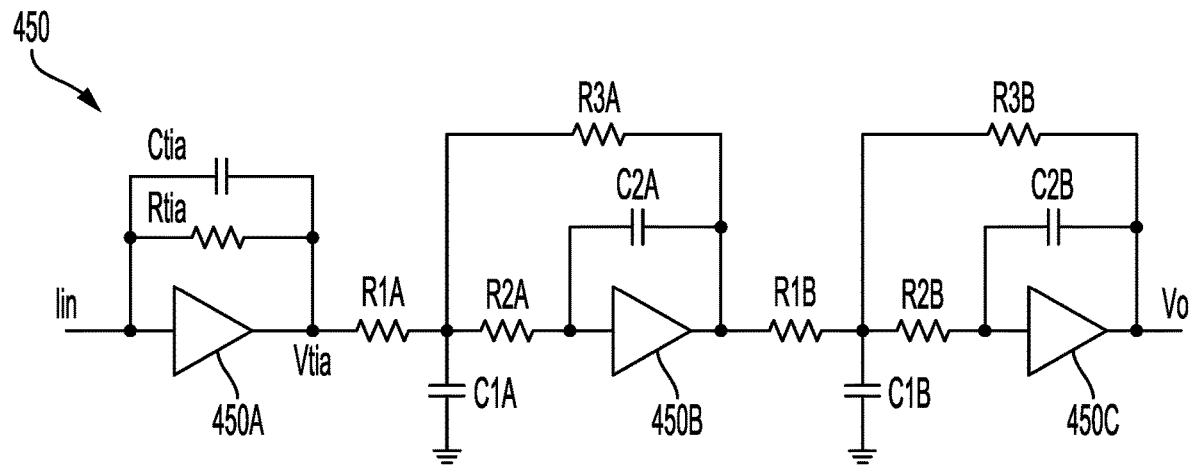
FIG. 4E is a circuit schematic illustrating one configuration of the configurable baseband filter (BBF) of FIG. 3 as a fifth-order baseband filter according to one or more aspects.

FIG. 4E is a circuit 450 schematic illustrating one configuration of the configurable baseband filter (BBF) of FIG. 3 as a fifth-order baseband filter according to one or more aspects. In FIG. 4E, a first amplifier 450A is coupled to a second amplifier 450B through resistances R1A and R2A. A feedback path around first amplifier 450A may include a resistance Rtia in parallel with a capacitance Ctia. A feedback path around second amplifier 450B may include a capacitance C2A. A feedback path from an output of the second amplifier 450B may be provided to a node between the resistance R1A and R2A, which is coupled to a negative power supply (e.g., gnd) through a capacitance C1A. A third amplifier 450C may be coupled to the second amplifier 450B through resistances R1B and R2B. A feedback around the third amplifier 450C may include a capacitance C2B. An output (Vo) of the third amplifier 450C may be fed back to a node between R1B and R2B, which is coupled to a negative power supply (e.g., gnd) through capacitance C1B. The configuration of FIG. 4E may be obtained from the circuit of FIG. 3 by opening switches 320J, 320I, 320C, 320E, 320H, 320G and closing switches 320A, 320B, 320D, 320F of FIG. 3.

In addition to or in the alternative to reconfiguring the BBF based on jammer detection, the BBF may be reconfigured to filter the baseband signal to obtain a signal appropriate for the ADC operating in the baseband processing. Supporting multiple ADCs within the baseband processing is useful for using a single IC for processing multiple wireless communications systems, and particularly when the wireless communications systems have signals with different characteristics. For example, 5G mmWave signals and 5G sub-7 GHz signals may both be used in a 5G communications system but may use different baseband processing components tuned to the disparate characteristics used for 5G mmWave signals and 5G sub-7 GHz signals. The BBF may be configured based on whether 5G mmWave signals or 5G sub-7 GHz signals are being processed in the baseband circuitry.

Figure 5:
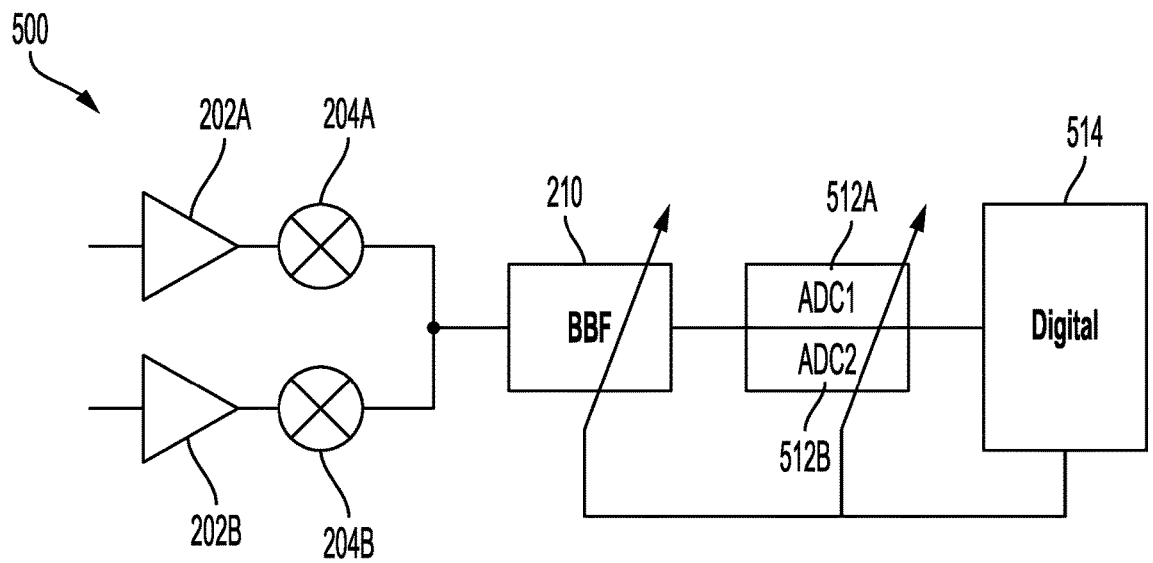
FIG. 5 is a block diagram illustrating a receive path for a wireless signal with a configurable baseband filter (BBF) and ADC according to one or more aspects.

FIG. 5 is a block diagram illustrating a receive path for a wireless signal with a configurable baseband filter (BBF) and ADC according to one or more aspects. A circuit 500 may include a plurality of ADCs, such as ADCs 512A and 512B. The ADCs 512A and 512B may have different characteristics with different input signal requirements. The digital circuitry 514 may be configured to determine one or more of the ADCs 512A and 512B based on one or more criteria, such as a currently active wireless communications system or current carrier allocation in the wireless communications system. The configurable BBF 210 may be configured by the digital circuitry 514 according to which of the plurality of ADCs 512A and 512B is active. In one example, ADC 512A is a sigma-delta ADC (SD-ADC), which may provide good dynamic range at low frequencies, but has a maximum frequency of operation that is below some wireless communications for the circuit 500. The ADC 512B may be a successive-approximation-register ADC (SAR-ADC), which may have improved dynamic range over the SD-ADC when signal bandwidths are large. The combination of SD-ADCs and SAR-ADCs may be useful in a single IC chip for supporting 5G mmWave signals and 5G sub-7 GHz signals, by using a SD-ADC for 5G sub-7 GHz signals and using a SAR-ADC for 5G mmWave signals. In some examples, both a SD-ADC and a SAR-ADC may be used for mmWave signals, but the BBF 210 is configured differently for different combinations of ADC and signal characteristics. Different filter orders may be configured for the configurable BBF 210 based on which of the ADCs 512A and 512B are active, such that the BBF 210 characteristics are matched to the active ADC. For example, the BBF 210 may be configured as a second-order filter when an SD-ADC path is active and may be configured as a third-order filter when a SAR-ADC path is active. In some examples, the circuit 410 is used for mmWave signals with a SD-ADC having a first sampling frequency, the circuit 420 is used for mmWave signals with a SD-ADC having a second sampling frequency, the circuit 420 is used for mmWave signals with a SAR-ADC having the first sampling frequency, and the circuit 450 is used for mmWave signals with a SAR-ADC having the second sampling frequency. The second sampling frequency may be higher than the first sampling frequency. In one example, the second sampling frequency is two to six times higher than the first sampling frequency. In some examples, a portion (e.g., not the entire bandwidth, but a "chunk" of the bandwidth) of a signal derived from a mmWave signal is processed through the BBF 210 and the ADC 212 or 512.

Figure 6:
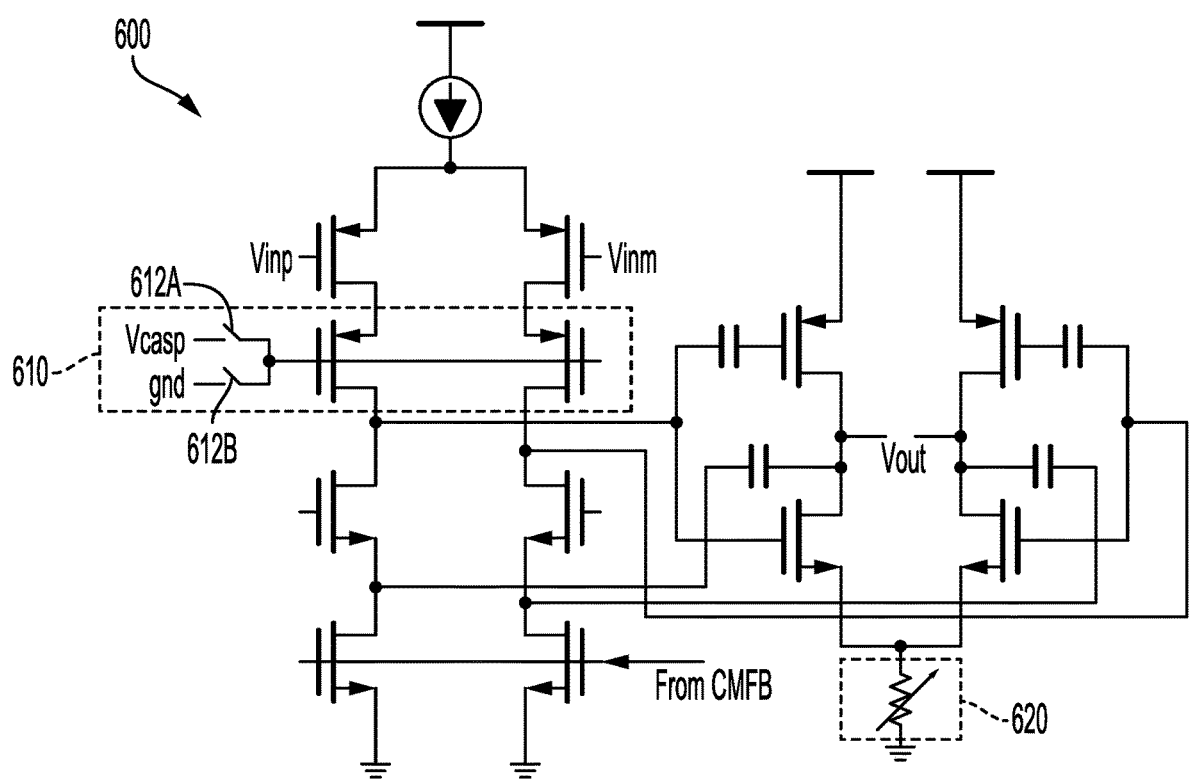
FIG. 6 is a circuit schematic illustrating an operational amplifier with a switchable cascode for a configurable baseband filter according to one or more aspects.

The operational amplifiers (e.g., the amplifiers 310) of a configurable BBF may include configurable features that may be controlled by the digital circuitry 214 or 514 in addition to configuring of the bandwidth and filter order of the BBF and/or configuring the ADCs. For example, a switchable cascode may be located in the operational amplifier to reconfigure between a switch in high-bandwidth configurations and a cascode device in low-bandwidth configurations. For example, a transistor used as a switchable cascode 610 may be switched between being in saturation region or in the triode region. When coupled to ground (or another negative power supply) the transistor is in triode region acting like a switch, otherwise in saturation like a cascode device. An example operational amplifier circuit with such a cascode configuration is shown in FIG. 6. FIG. 6 is a circuit schematic illustrating an operational amplifier with a switchable cascode for a configurable baseband filter according to one or more aspects. A circuit 600 for an operational amplifier may include a switchable cascode 610. Transistors of the switchable cascode 610 may be configured with a gate terminal to switch between a bias voltage and a ground. Switches 612A and 612B are coupled between the transistor and the bias voltage and the ground, respectively. The reconfiguration of switches 612A and 612B may change gain and/or frequency response of the operational amplifier 600. In lower-bandwidth modes, the operational amplifier 600 may be reconfigured for 5G sub-7 GHz signals to have high gain at low frequencies. In higher-bandwidth modes, the operational amplifier 600 may be reconfigured for increased gain at high frequencies. The bandwidth configuration may include settings for the switchable cascode 610 that change the signal coupled to the gate of transistors within the switchable cascode 610. A variable component 620, such as a variable resistor or variable impedance, may be used to adjust the DC voltage of the first stage output in the operational amplifier. When switchable cascode 610 is configured as a switch, variable component 620 is increased to create more headroom for the bottom NMOS transistors in the first stage of the operational amplifier. A common mode feedback (CMFB) signal may be received at the circuit 600 from another circuit that is coupled to the $V_{out}$ signal of circuit 600. Various combinations of the different adjustments discussed herein (and, in some embodiments, other adjustments, such as an amount of current, biases, etc.) may be used to implement different settings.

Figure 7:
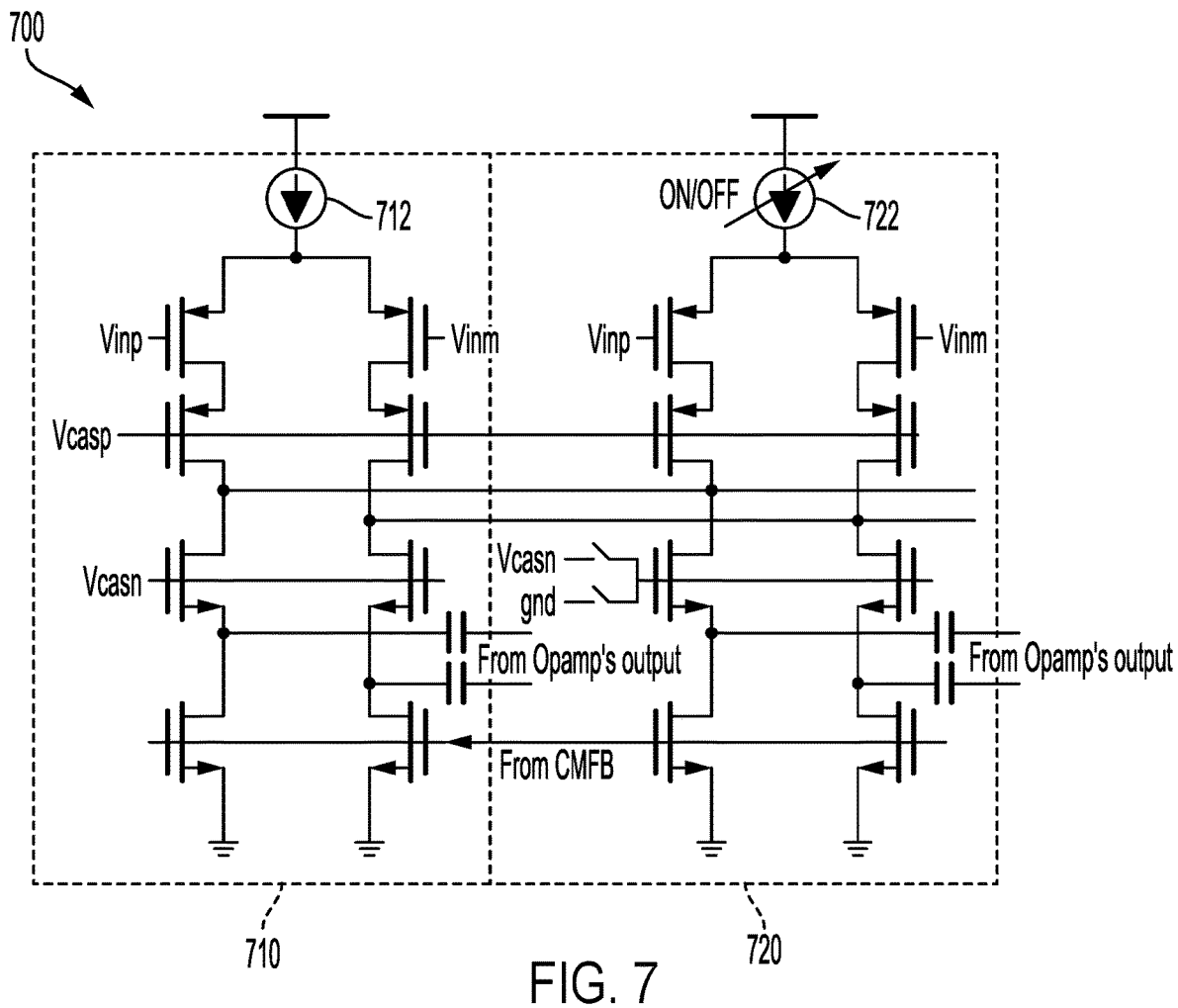
FIG. 7 is a circuit schematic illustrating an operational amplifier with configurable slices for a configurable baseband filter according to one or more aspects.

Another feature that may be additionally or alternatively included in operational amplifiers (e.g., amplifiers 310) of a configurable BBF 210 is configurable slices. The operational amplifier's input stage may be sliceable to improve efficiency as measured by noise versus power. One example of an operational amplifier with two slices is shown in FIG. 7. FIG. 7 is a circuit schematic illustrating an operational amplifier with configurable slices for a configurable baseband filter according to one or more aspects. The operational amplifier circuit 700 may include slices 710 and 720, identified by having a parallel structure of transistors driven by current source 712 and 722, respectively. One or more of the current sources 712 and 722 may be controlled independently of the other current sources such that one or more of the current sources may be disabled to reduce gain and/or reduce power consumption. The operational amplifier circuit 700 may have a noise transfer function that is different when the configurable BBF 210 is changed, such as in the example of when the same operational amplifier contributes less noise in a biquad configuration versus in a Rauch configuration. More than two slices may be implemented. For example, another slice having an independently controlled current source may be implemented in parallel to the slices 710 and 720.

Figure 8:
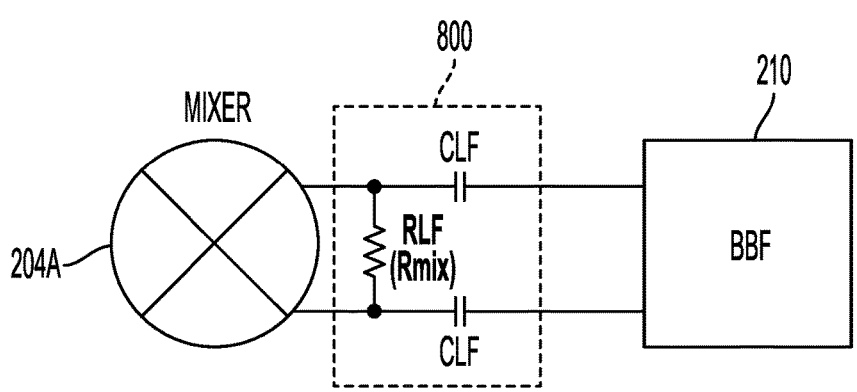
FIG. 8 is a circuit schematic illustrating a high-pass filter for use with a configurable baseband filter according to one or more aspects.

The mixer-BBF interface may include a low-pass filter for reducing the effects of a jammer scenario. Replacing the low-pass filter with a high-pass filter may attenuate some of the in-gap jammers. FIG. 8 is a circuit schematic illustrating a high-pass filter for use with a configurable baseband filter according to one or more aspects. In FIG. 8, the mixer 204A is coupled to the BBF 210 through high-pass filter 800, which may include a resistor RLF coupled between outputs of the mixer 204A. Further, the high-pass filter 800 may include a capacitance CLF coupled between each output of the mixer 204A and the BBF 210.

Figure 9:
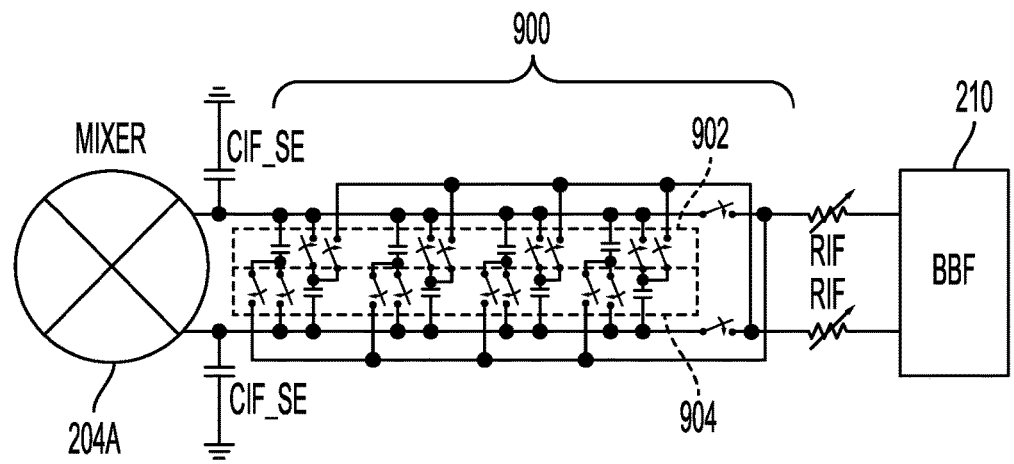
FIG. 9 is a circuit schematic illustrating a capacitor bank for use with a configurable baseband filter according to one or more aspects.

A high-pass filter may alternatively or additionally be included as a capacitor bank. FIG. 9 is a circuit schematic illustrating a capacitor bank for use with a configurable baseband filter according to one or more aspects. A circuit includes a high-pass filter 900, which includes a first plurality of capacitors 902 and a second plurality of capacitors 904. The capacitor bank of capacitors 902 and 904 operate as a HPF. As shown in FIG. 9, the filter 900 includes a first plurality of capacitors (e.g., the bank 902), each of the first plurality of capacitors coupled to a first output of the mixer and at least two switches comprising a first switch coupling one of the first plurality of capacitors to a second output of the mixer and a second switch coupling the one of the first plurality of capacitors to the first output of the mixer; and a second plurality of capacitors (e.g., the bank 904), each of the second plurality of capacitors coupled to the second output of the mixer and at least two switches comprising a first switch coupling one of the second plurality of capacitors to the first output of the mixer and a second switch coupling the one of the second plurality of capacitors to the second output of the mixer. The capacitors in FIG. 9 may be connected to different connection points represented as dots in FIG. 9. When one end of the capacitor is connected through switches to the dots on the same side as the other end, the configuration is for a high pass filter. Otherwise the configuration is for a low pass filter. The switches within the circuit may be controlled by logic circuitry, such as in controller 214 of FIG. 2 or controller 514 of FIG. 5.

Figure 10A:
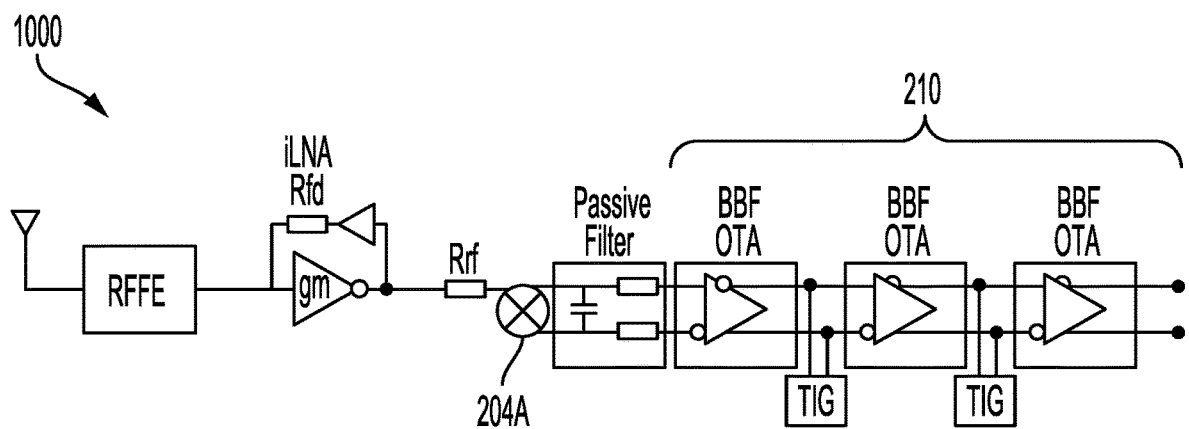
FIG. 10A is a block diagram illustrating a reconfigurable receiver chain with a reconfigurable baseband filter according to one or more aspects.
Figure 10B:
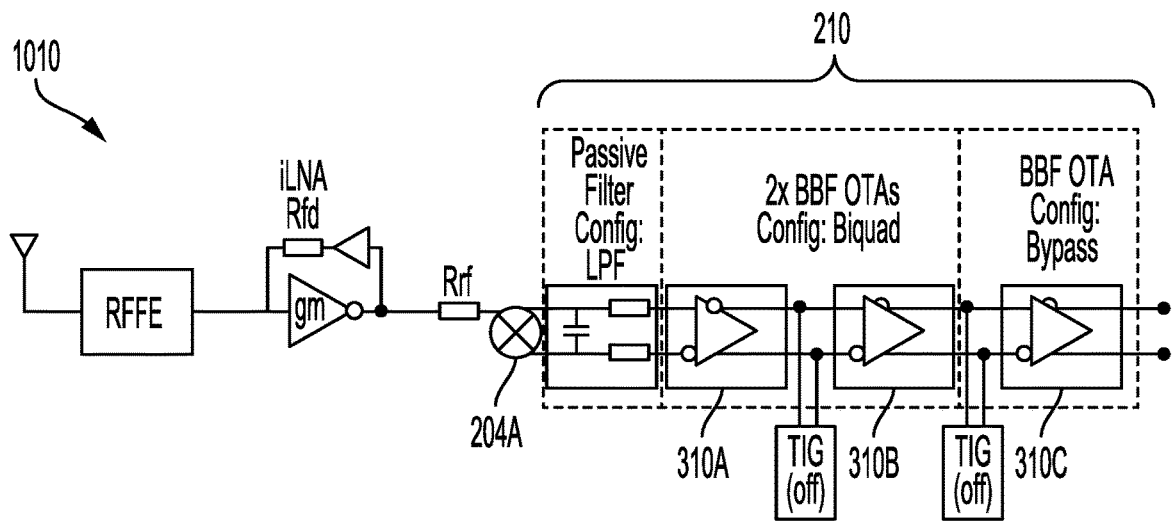
FIG. 10B is a block diagram illustrating operation of the reconfigurable receiver chain of FIG. 10A in a first configuration according to one or more aspects.
Figure 10C:
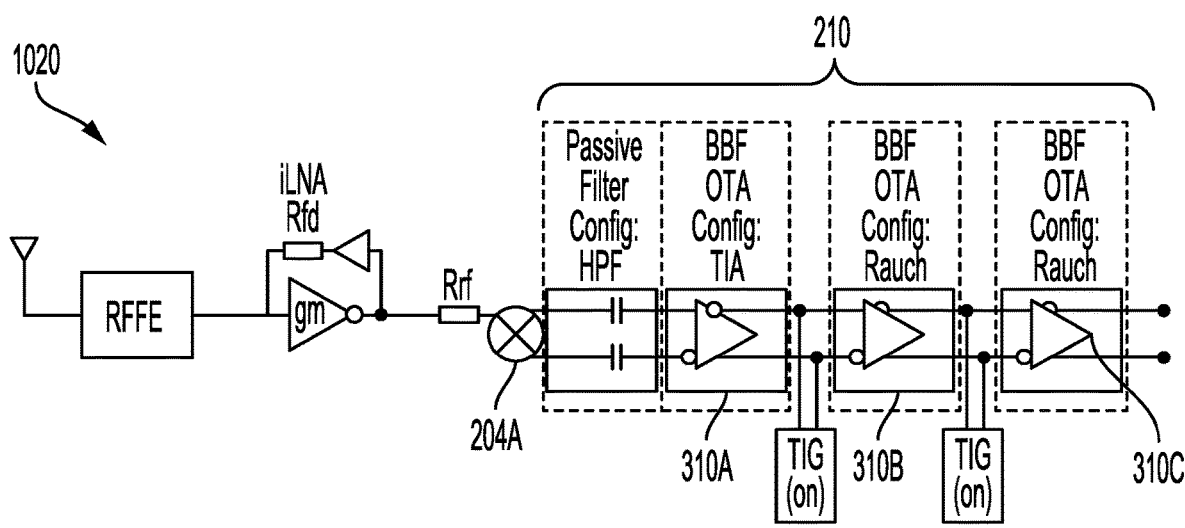
FIG. 10C is a block diagram illustrating operation of the reconfigurable receiver chain of FIG. 10A in a second configuration according to one or more aspects.

As described in embodiments herein, a receive path may include various configurable components to facilitate processing of wireless signals through configurations that are determined to correspond to certain conditions of the wireless communication system. FIG. 10A is a block diagram illustrating a reconfigurable receiver chain with a reconfigurable baseband filter according to one or more aspects. Reconfigurable processing path 1000 begins with a RFFE module that receives an RF input signal from an antenna. The RF input signal is processed through the radio-frequency front end (RFFE) module, optionally passed to an amplifier gm and/or a degeneration resistor (Rrf), and then provided to the mixer 204A. The output of the mixer 204A is a baseband signal that may be passed through a passive filter (e.g., the filter 800 or 900, or another filter) and then through the configurable BBF 210. While a single mixer is recited/illustrated, a direct conversion or super-heterodyne architecture may be used, or a device may select between the two depending on the signal being received. Different configurations for the BBF 210 are shown in FIG. 10A, FIG. 10B, and FIG. 10C. As shown in FIG. 10A, the BBF 210 may include a BBF Operational Transconductance Amplifier (OTA) followed by a triple gyrator invertor implementation of a notch filter, followed by another BBF OTA, another TIG, and another BBF OTA.

In some embodiments, the reconfigurable processing path 1000 may support the operation as shown in FIG. 10B. FIG. 10B is a block diagram illustrating operation of the reconfigurable receiver chain of FIG. 10A in a first configuration according to one or more aspects. Amplifiers 310A and 310B may be configured as biquad amplifiers, and amplifier 310C may be configured as a bypass. The configuration of FIG. 10B may be used in legacy mode with an active LNA, mixer, LPF, and biquad configurations. Further, the TIG are turned off.

In some embodiments, the reconfigurable processing path 1000 may support the operation in FIG. 10C. FIG. 10C is a block diagram illustrating operation of the reconfigurable receiver chain of FIG. 10A in a second configuration according to one or more aspects. Amplifier 310A may be configured as a transimpedance amplifier (TIA), and amplifiers 310B and 310C may be configured in a Rauch configuration (such as with an operational amplifier configured with R1, R2, R3, C1, and C2 as shown in FIG. 4B), with a high-pass filter (HPF) configured as in FIG. 8 or FIG. 9 inserted between mixer 204A and the amplifier 310A. FIG. 10C illustrates reconfiguration in second carrier (SCA) (OZIF) mode, in which active elements include the LNA, mixer, HPF, TIA, TIG (turned on), and Rauch. Amplifier 310A may be a OTA amplifier that may be configured with appropriate resistors and capacitors surrounding the OTA to configure the OTA as a TIA.

Figure 11:
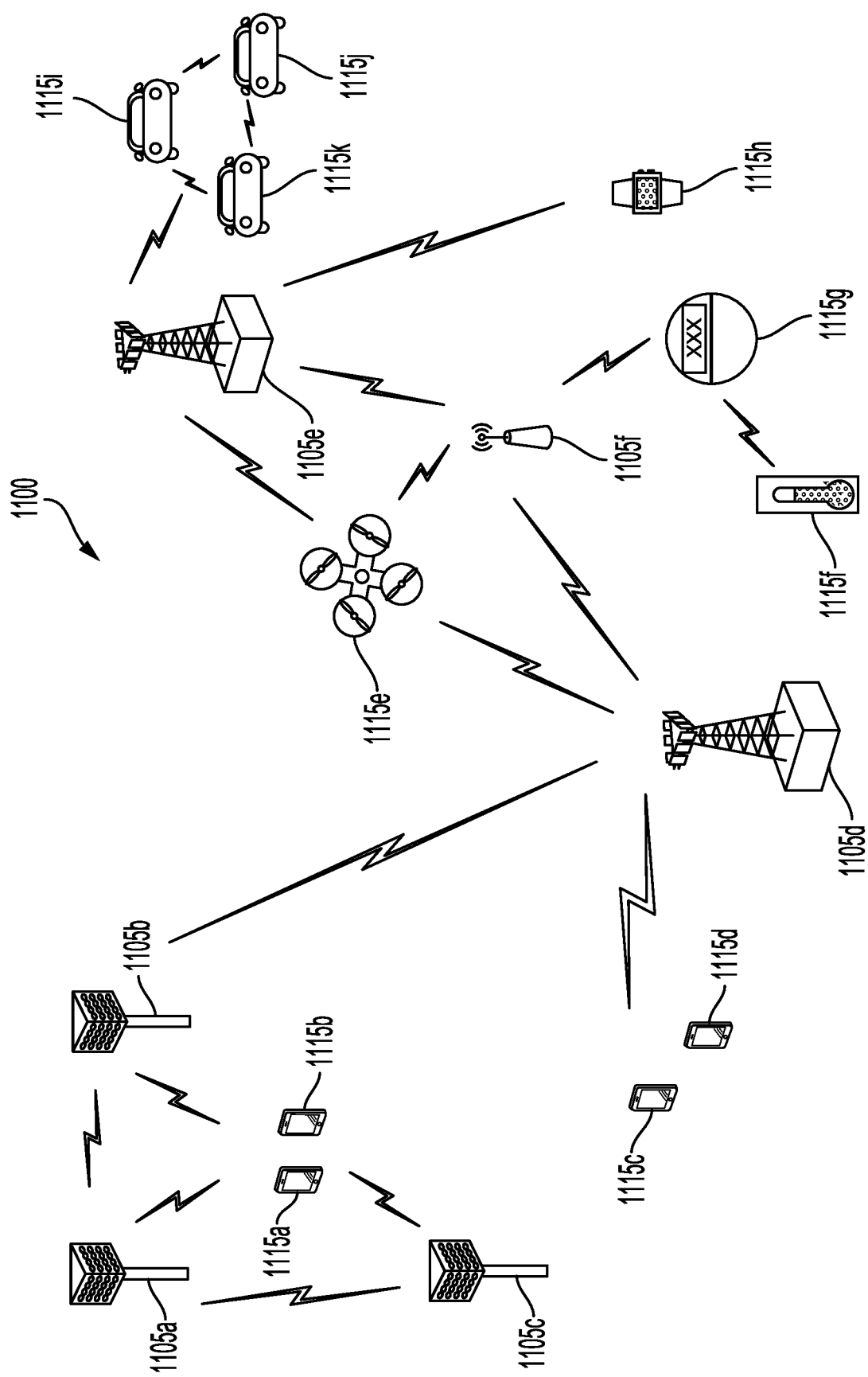
FIG. 11 is a block diagram illustrating details of an example wireless communication system according to one or more aspects.
Figure 12:
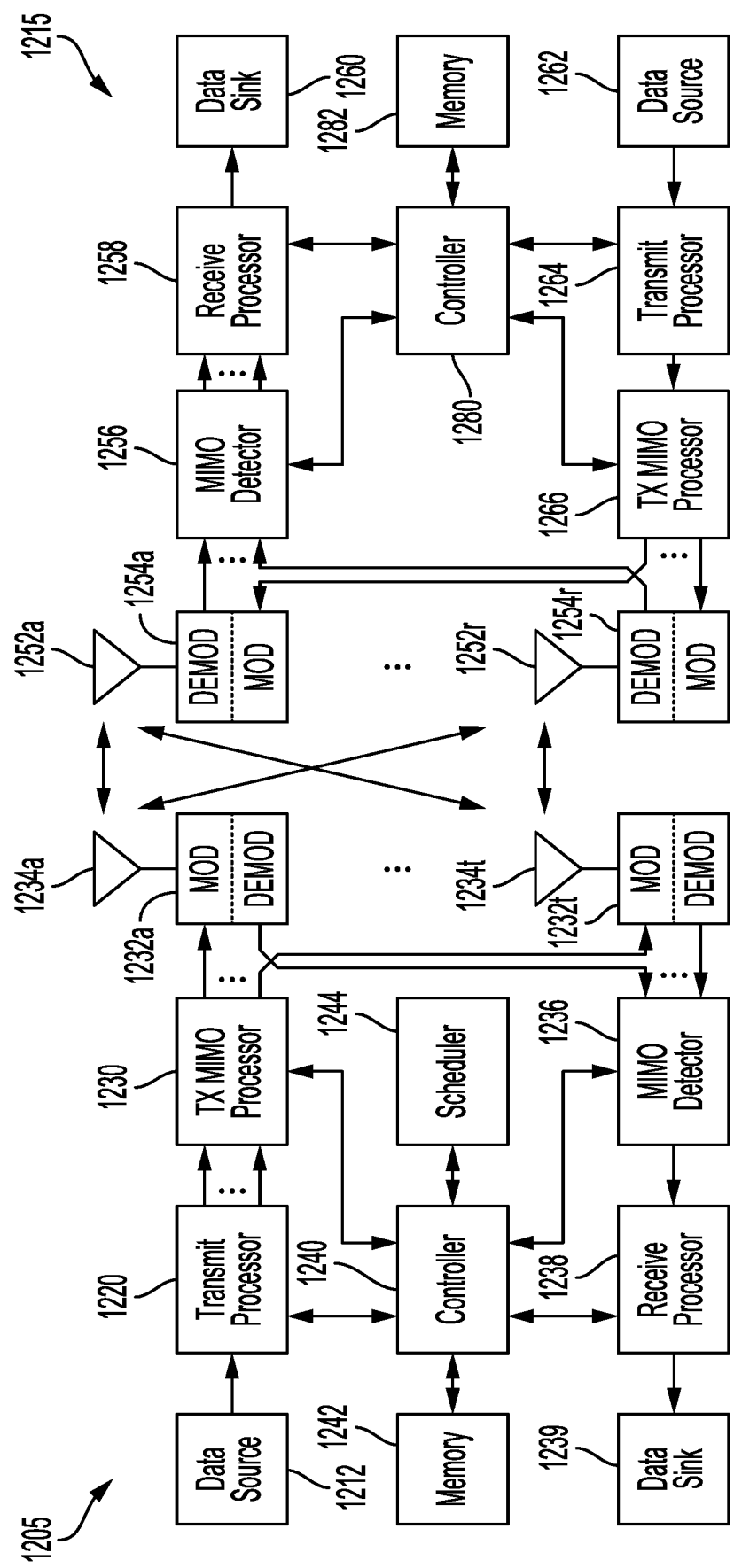
FIG. 12 is a block diagram illustrating examples of a base station and a user equipment (UE) according to one or more aspects.

The RF and baseband processing circuitry described above may be used in wireless networks such as those illustrated in FIG. 11 and FIG. 12. For example, the digital circuitry referred to above may be included in any of elements 1212, 1215, 1220, 1230, 1242, 1240, 1244, 1239, 1238, and 1236, or other such elements. The RF circuitry and baseband processing circuitry (e.g., the amplifiers 202, mixers 204, BBF 210, ADC 212, circuitry 214, 514) may be included in demodulator (DEMOD) 1232a, 1232t, 1254a, and/or 1254r. FIG. 11 is a block diagram illustrating details of an example wireless communication system according to one or more aspects. The wireless communication system may include wireless network 1100. Wireless network 1100 may, for example, include a 5G wireless network. As appreciated by those skilled in the art, components appearing in FIG. 11 are likely to have related counterparts in other network arrangements including, for example, cellular-style network arrangements and non-cellular-style-network arrangements (e.g., device to device or peer to peer or ad hoc network arrangements, etc.).

Wireless network 1100 illustrated in FIG. 11 includes a number of base stations 1105 and other network entities. A base station may be a station that communicates with the UEs and may also be referred to as an evolved node B (eNB), a next generation eNB (gNB), an access point, and the like. Each base station 1105 may provide communication coverage for a particular geographic area. In 3GPP, the term "cell" may refer to this particular geographic coverage area of a base station or a base station subsystem serving the coverage area, depending on the context in which the term is used. In implementations of wireless network 1100 herein, base stations 1105 may be associated with a same operator or different operators (e.g., wireless network 1100 may include a plurality of operator wireless networks). Additionally, in implementations of wireless network 1100 herein, base station 1105 may provide wireless communications using one or more of the same frequencies (e.g., one or more frequency bands in licensed spectrum, unlicensed spectrum, or a combination thereof) as a neighboring cell. In some examples, an individual base station 1105 or UE 1115 may be operated by more than one network operating entity. In some other examples, each base station 1105 and UE 1115 may be operated by a single network operating entity. Either the base station 1105 or the UE 1115 or other devices communicating on the wireless network 1100 (for example, a customer premises equipment (CPE)) may implement embodiments of receiver circuitry described herein.

A base station may provide communication coverage for a macro cell or a small cell, such as a pico cell or a femto cell, or other types of cell. A macro cell generally covers a relatively large geographic area (e.g., several kilometers in radius) and may allow unrestricted access by UEs with service subscriptions with the network provider. A small cell, such as a pico cell, would generally cover a relatively smaller geographic area and may allow unrestricted access by UEs with service subscriptions with the network provider. A small cell, such as a femto cell, would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). A base station for a macro cell may be referred to as a macro base station. A base station for a small cell may be referred to as a small cell base station, a pico base station, a femto base station or a home base station. In the example shown in FIG. 11, base stations 1105d and 1105e are regular macro base stations, while base stations 1105a-1105c are macro base stations enabled with one of 3 dimension (3D), full dimension (FD), or massive MIMO. Base stations 1105a-1105c take advantage of their higher dimension MIMO capabilities to exploit 3D beamforming in both elevation and azimuth beamforming to increase coverage and capacity. Base station 1105f is a small cell base station which may be a home node or portable access point. A base station may support one or multiple (e.g., two, three, four, and the like) cells.

Wireless network 1100 may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. In some scenarios, networks may be enabled or configured to handle dynamic switching between synchronous or asynchronous operations.

UEs 1115 are dispersed throughout the wireless network 1100, and each UE may be stationary or mobile. It should be appreciated that, although a mobile apparatus is commonly referred to as a UE in standards and specifications promulgated by the 3GPP, such apparatus may additionally or otherwise be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, a gaming device, an augmented reality device, vehicular component, vehicular device, or vehicular module, or some other suitable terminology. Within the present document, a "mobile" apparatus or UE need not necessarily have a capability to move, and may be stationary. Some non-limiting examples of a mobile apparatus, such as may include implementations of one or more of UEs 1115, include a mobile, a cellular (cell) phone, a smart phone, a session initiation protocol (SIP) phone, a wireless local loop (WLL) station, a laptop, a personal computer (PC), a notebook, a netbook, a smart book, a tablet, and a personal digital assistant (PDA). A mobile apparatus may additionally be an IoT or "Internet of everything" (IoE) device such as an automotive or other transportation vehicle, a satellite radio, a global positioning system (GPS) device, a global navigation satellite system (GNSS) device, a logistics controller, a drone, a multicopter, a quad-copter, a smart energy or security device, a solar panel or solar array, municipal lighting, water, or other infrastructure; industrial automation and enterprise devices; consumer and wearable devices, such as eyewear, a wearable camera, a smart watch, a health or fitness tracker, a mammal implantable device, gesture tracking device, medical device, a digital audio player (e.g., MP3 player), a camera, a game console, etc.; and digital home or smart home devices such as a home audio, video, and multimedia device, an appliance, a sensor, a vending machine, intelligent lighting, a home security system, a smart meter, etc. In one aspect, a UE may be a device that includes a Universal Integrated Circuit Card (UICC). In another aspect, a UE may be a device that does not include a UICC. In some aspects, UEs that do not include UICCs may also be referred to as IoE devices. UEs 1115a-1115d of the implementation illustrated in FIG. 11 are examples of mobile smart phone-type devices accessing wireless network 1100. A UE may also be a machine specifically configured for connected communication, including machine type communication (MTC), enhanced MTC (eMTC), narrowband IoT (NB-IoT) and the like. UEs 1115e-1115k illustrated in FIG. 11 are examples of various machines configured for communication that access wireless network 1100.

A mobile apparatus, such as UEs 1115, may be able to communicate with any type of the base stations, whether macro base stations, pico base stations, femto base stations, relays, and the like. In FIG. 11, a communication link (represented as a lightning bolt) indicates wireless transmissions between a UE and a serving base station, which is a base station designated to serve the UE on the downlink or uplink, or desired transmission between base stations, and backhaul transmissions between base stations. UEs may operate as base stations or other network nodes in some scenarios. Backhaul communication between base stations of wireless network 100 may occur using wired or wireless communication links.

In operation at wireless network 1100, base stations 1105a-1105c serve UEs 1115a and 1115b using 3D beamforming and coordinated spatial techniques, such as coordinated multipoint (CoMP) or multi-connectivity. Macro base station 1105d performs backhaul communications with base stations 1105a-1105c, as well as small cell, base station 1105f. Macro base station 1105d also transmits multicast services which are subscribed to and received by UEs 1115c and 1115d. Such multicast services may include mobile television or stream video, or may include other services for providing community information, such as weather emergencies or alerts, such as Amber alerts or gray alerts.

Wireless network 1100 of some implementations supports mission critical communications with ultra-reliable and redundant links for mission critical devices, such as UE 1115e, which is a drone. Redundant communication links with UE 1115e include from macro base stations 1105d and 1105e, as well as small cell base station 1105f. Other machine type devices, such as UE 1115f (thermometer), UE 1115g (smart meter), and UE 1115h (wearable device) may communicate through wireless network 1100 either directly with base stations, such as small cell base station 1105f, and macro base station 1105e, or in multi-hop configurations by communicating with another user device which relays its information to the network, such as UE 1115f communicating temperature measurement information to the smart meter, UE 1115g, which is then reported to the network through small cell base station 1105f. Wireless network 1100 may also provide additional network efficiency through dynamic, low-latency TDD communications or low-latency FDD communications, such as in a vehicle-to-vehicle (V2V) mesh network between UEs 1115i-1115k communicating with macro base station 1105e.

FIG. 12 is a block diagram illustrating examples of base station 1105 and UE 1115 according to one or more aspects. Base station 1105 and UE 1115 may be any of the base stations and one of the UEs in FIG. 11. For a restricted association scenario (as mentioned above), base station 1105 may be small cell base station 1105f in FIG. 11, and UE 1115 may be UE 1115c or 1115d operating in a service area of base station 1105f, which in order to access small cell base station 1105f, would be included in a list of accessible UEs for small cell base station 1105f. Base station 1105 may also be a base station of some other type. As shown in FIG. 12, base station 1105 may be equipped with antennas 1234a through 1234t, and UE 1115 may be equipped with antennas 1252a through 1252r for facilitating wireless communications.

At base station 1105, transmit processor 1220 may receive data from data source 1212 and control information from controller 1240, such as a processor. The control information may be for a physical broadcast channel (PBCH), a physical control format indicator channel (PCFICH), a physical hybrid-ARQ (automatic repeat request) indicator channel (PHICH), a physical downlink control channel (PDCCH), an enhanced physical downlink control channel (EPDCCH), an MTC physical downlink control channel (MPDCCH), etc. The data may be for a physical downlink shared channel (PDSCH), etc. Additionally, transmit processor 1220 may process (e.g., encode and symbol map) the data and control information to obtain data symbols and control symbols, respectively. Transmit processor 1220 may also generate reference symbols, e.g., for the primary synchronization signal (PSS) and secondary synchronization signal (SSS), and cell-specific reference signal. Transmit (TX) MIMO processor 1230 may perform spatial processing (e.g., precoding) on the data symbols, the control symbols, or the reference symbols, if applicable, and may provide output symbol streams to modulators (MODs) 1232a through 1232t. For example, spatial processing performed on the data symbols, the control symbols, or the reference symbols may include precoding. Each modulator 1232 may process a respective output symbol stream (e.g., for OFDM, etc.) to obtain an output sample stream. Each modulator 1232 may additionally or alternatively process (e.g., convert to analog, amplify, filter, and upconvert) the output sample stream to obtain a downlink signal. Downlink signals from modulators 1232a through 1232t may be transmitted via antennas 1234a through 1234t, respectively.

At UE 1115, antennas 1252a through 1252r may receive the downlink signals from base station 1105 and may provide received signals to demodulators (DEMODs) 1254a through 1254r, respectively. Each demodulator 1254 may condition (e.g., filter, amplify, downconvert, and digitize) a respective received signal to obtain input samples. Each demodulator 1254 may further process the input samples (e.g., for OFDM, etc.) to obtain received symbols. MIMO detector 1256 may obtain received symbols from demodulators 1254a through 1254r, perform MIMO detection on the received symbols if applicable, and provide detected symbols. Receive processor 1258 may process (e.g., demodulate, deinterleave, and decode) the detected symbols, provide decoded data for UE 1115 to data sink 1260, and provide decoded control information to controller 1280, such as a processor.

On the uplink, at UE 1115, transmit processor 1264 may receive and process data (e.g., for a physical uplink shared channel (PUSCH)) from data source 1262 and control information (e.g., for a physical uplink control channel (PUCCH)) from controller 1280. Additionally, transmit processor 1264 may also generate reference symbols for a reference signal. The symbols from transmit processor 1264 may be precoded by TX MIMO processor 1266 if applicable, further processed by modulators 1254a through 1254r (e.g., for SC-FDM, etc.), and transmitted to base station 1105. At base station 1105, the uplink signals from UE 1115 may be received by antennas 1234, processed by demodulators 1232, detected by MIMO detector 1236 if applicable, and further processed by receive processor 1238 to obtain decoded data and control information sent by UE 1115. Receive processor 1238 may provide the decoded data to data sink 1239 and the decoded control information to controller 1240.

Controllers 1240 and 1280 may direct the operation at base station 1105 and UE 1115, respectively. Controller 1240 or other processors and modules at base station 1105 or controller 1280 or other processors and modules at UE 1115 may perform or direct the execution of various processes within the devices and/or the wireless network. Memories 1242 and 1282 may store data and program codes for base station 1105 and UE 1115, respectively. Scheduler 1244 may schedule UEs for data transmission on the downlink or the uplink.

In some cases, UE 1115 and base station 1105 may operate in a shared radio frequency spectrum band, which may include licensed or unlicensed (e.g., contention-based) frequency spectrum. In an unlicensed frequency portion of the shared radio frequency spectrum band, UEs 1115 or base stations 1105 may traditionally perform a medium-sensing procedure to contend for access to the frequency spectrum. For example, UE 1115 or base station 1105 may perform a listen-before-talk or listen-before-transmitting (LBT) procedure such as a clear channel assessment (CCA) prior to communicating to determine whether the shared channel is available. In some implementations, a CCA may include an energy detection procedure to determine whether there are any other active transmissions. For example, a device may infer that a change in a received signal strength indicator (RSSI) of a power meter indicates that a channel is occupied. Specifically, signal power that is concentrated in a certain bandwidth and exceeds a predetermined noise floor may indicate another wireless transmitter. A CCA also may include detection of specific sequences that indicate use of the channel. For example, another device may transmit a specific preamble prior to transmitting a data sequence. In some cases, an LBT procedure may include a wireless node adjusting its own back-off window based on the amount of energy detected on a channel or the acknowledge/negative-acknowledge (ACK/NACK) feedback for its own transmitted packets as a proxy for collisions.

In one or more aspects, techniques for processing radio frequency (RF) signals may include using a reconfigurable baseband filter (BBF) or reconfiguring a baseband filter (BBF), such as any single aspect or any combination of aspects described below or in connection with one or more other processes or devices described elsewhere herein. In one or more aspects (e.g., in a first aspect), an apparatus may include an input port for receiving a baseband (BB) input signal; a configurable BB filter coupled to the input port; and/or logic circuitry coupled to the configurable BB filter. In some embodiments, the configurable BB Filter comprises a plurality of configurable operational amplifiers coupled in series to form a reconfigurable receiver chain. In some embodiments, at least one of the plurality of operational amplifiers comprises a transistor with a gate configured to be coupled to or disconnected from a cascode bias. The logic circuitry may be configured for evaluating one or more criteria relating to a BB input signal to a configurable BB filter. The logic circuity may also include circuitry for configuring the configurable BB filter based, at least in part, on evaluating the one or more criteria. The apparatus may be a wireless device, such as a user equipment (UE) or a base station (BS). In some implementations, the apparatus may include at least one processor, and a memory coupled to the processor. The processor may be configured to perform operations described herein with respect to the apparatus. In some other implementations, the operations may be embedded in a non-transitory computer-readable medium in program code recorded thereon and the program code may be executable by a computer for causing the computer to perform operations described herein with reference to the apparatus. In some implementations, the method may be performed by one or more means configured to perform operations described herein. In some implementations, a method of wireless communication may include one or more operations described herein with reference to the apparatus.

In a second aspect, in combination with the first aspect, configuring the configurable BB filter comprises configuring a filter order and a filter bandwidth of the configurable BB filter based, at least in part, on the evaluating of the one or more criteria.

In a third aspect, in combination with one or more of the first aspect or the second aspect, the evaluating the one or more criteria comprises determining whether a first analog-to-digital converter (ADC) of a plurality of ADCs is coupled to the configurable BB filter; and determining whether a second analog-to-digital converter (ADC) of the plurality of ADCs is coupled to the configurable BB filter.

In a fourth aspect, in combination with one or more of the first through third aspects, determining whether a first analog-to-digital converter (ADC) of a plurality of ADCs is coupled to the configurable BB filter comprises determining whether a sigma-delta ADC (SD-ADC) is coupled to the configurable BB filter; and determining whether a second analog-to-digital converter (ADC) of the plurality of ADCs is coupled to the configurable BB filter comprises determining whether a successive-approximation-register ADC (SAR-ADC) is coupled to the configurable BB filter.

In a fifth aspect, in combination with one or more of the first through fourth aspects, configuring the configurable BB filter comprises configuring the configurable BB filter as a second-order filter when the SD-ADC is determined to be coupled to the configurable BB filter; and configuring the configurable BB filter as a third-order filter when the SAR-ADC is determined to be coupled to the configurable BB filter.

In a sixth aspect, in combination with one or more of the first through fifth aspects, configuring the configurable BB filter comprises configuring the configurable BB filter with a first bandwidth when the SD-ADC is determined to be coupled to the configurable BB filter; and configuring the configurable BB filter with a second bandwidth higher than the first bandwidth when the SAR-ADC is determined to be coupled to the configurable BB filter.

In a seventh aspect, in combination with one or more of the first through sixth aspects, evaluating the one or more criteria comprises determining whether the first ADC is coupled to the configurable BB filter by determining the BB input signal is based on a 5G sub-7 GHz RF signal; and determining whether the second ADC is coupled to the configurable BB filter by determining the BB input signal is based on a 5G mmWave RF signal.

In an eighth aspect, in combination with one or more of the first through seventh aspects, evaluating the one or more criteria comprises detecting one or more jammer signals.

In a ninth aspect, in combination with one or more of the first through eighth aspects, the logic circuitry may be further configured to: in response to a jammer signal being detected with a signal strength above a threshold level, configuring the configurable BB filter with a first bandwidth; and in response to no jammer signal being detected with a signal strength above a threshold level, configuring the configurable BB filter with a second bandwidth higher than the first bandwidth.

In a tenth aspect, in combination with one or more of the first through ninth aspects, the plurality of operational amplifiers comprises a plurality of configurable feedback loops coupled at an input and an output to a corresponding operational amplifier of the plurality of operational amplifiers. In some aspects, the configurable BB filter comprises a plurality of operational amplifiers coupled in series, each operational amplifier of the plurality of operational amplifiers coupled at an input and an output to a corresponding configurable feedback loop comprising at least one switch.

In an eleventh aspect, in combination with one or more of the first through tenth aspects, at least one operational amplifier of the plurality of operational amplifiers comprises at least two slices, wherein at least one of the at least two slices can be controlled independently from others of the at least two slices.

In a twelfth aspect, in combination with one or more of the first through eleventh aspects, the apparatus may include a mixer; and a high-pass filter (HPF) coupled to the mixer and to the input port.

In a thirteenth aspect, in combination with one or more of the first through twelfth aspects, the apparatus may include a mixer; and a capacitor bank coupled to the mixer and to the input port, wherein the capacitor bank comprises a first plurality of capacitors, each of the first plurality of capacitors coupled to a first output of the mixer and at least two switches comprising a first switch coupling one of the first plurality of capacitors to a second output of the mixer and a second switch coupling the one of the first plurality of capacitors to the first output of the mixer; and a second plurality of capacitors, each of the second plurality of capacitors coupled to the second output of the mixer and at least two switches comprising a first switch coupling one of the second plurality of capacitors to the first output of the mixer and a second switch coupling the one of the second plurality of capacitors to the second output of the mixer.

In one or more aspects, a method for supporting wireless communication on a device, such as including a processor; and a memory coupled to the processor and storing instructions that, when executed by the processor, cause the device to perform operations for a method for wireless communications, and the operations that may include additional aspects, such as any single aspect or any combination of aspects described below or in connection with one or more other processes or devices described elsewhere herein. In a fourteenth aspect, wireless communications may include evaluating one or more criteria relating to a BB input signal to a configurable BB filter; and configuring the configurable BB filter based, at least in part, on evaluating the one or more criteria. Additionally, the device may perform or operate according to one or more aspects of the method as described below. In some implementations, the method is performed by a wireless device, such as a user equipment (UE) or base station (BS). In some other implementations, the apparatus may include a non-transitory computer-readable medium having program code recorded thereon and the program code may be executable by a computer for causing the computer to perform operations described herein with reference to the apparatus. In some implementations, the apparatus may include one or more means configured to perform operations described herein.

In a fifteenth aspect, in combination with the fourteenth aspect, configuring the configurable BB filter comprises configuring a filter order and a filter bandwidth of the configurable BB filter based, at least in part, on the evaluating of the one or more criteria.

In a sixteenth aspect, in combination with the fourteenth aspect through the fifteenth aspect, evaluating the one or more criteria comprises determining whether a first analog-to-digital converter (ADC) of a plurality of ADCs is coupled to the configurable BB filter; and determining whether a second analog-to-digital converter (ADC) of the plurality of ADCs is coupled to the configurable BB filter.

In a seventeenth aspect, in combination with the fourteenth aspect through the sixteenth aspect, determining whether a first analog-to-digital converter (ADC) of a plurality of ADCs is coupled to the configurable BB filter comprises determining whether a sigma-delta ADC (SD-ADC) is coupled to the configurable BB filter; and determining whether a second analog-to-digital converter (ADC) of the plurality of ADCs is coupled to the configurable BB filter comprises determining whether a successive-approximation-register ADC (SAR-ADC) is coupled to the configurable BB filter.

In an eighteenth aspect, in combination with the fourteenth aspect through the seventeenth aspect, configuring the configurable BB filter comprises configuring the configurable BB filter as a second-order filter when the SD-ADC is determined to be coupled to the configurable BB filter; and configuring the configurable BB filter as a third-order filter when the SAR-ADC is determined to be coupled to the configurable BB filter.

In a nineteenth aspect, in combination with the fourteenth aspect through the eighteenth aspect, configuring the configurable BB filter comprises configuring the configurable BB filter with a first bandwidth when the SD-ADC is determined to be coupled to the configurable BB filter; and configuring the configurable BB filter with a second bandwidth higher than the first bandwidth when the SAR-ADC is determined to be coupled to the configurable BB filter.

In a twentieth aspect, in combination with the fourteenth aspect through the nineteenth aspect, evaluating the one or more criteria comprises determining whether the first ADC is coupled to the configurable BB filter by determining the BB input signal is based on a 5G sub-7 GHz RF signal; and determining whether the second ADC is coupled to the configurable BB filter by determining the BB input signal is based on a 5G mmWave RF signal.

In a twenty-first aspect, in combination with the fourteenth aspect through the twentieth aspect, evaluating the one or more criteria comprises detecting one or more jammer signals.

In a twenty-second aspect, in combination with the fourteenth aspect through the twenty-first aspect, in response to a jammer signal being detected with a signal strength above a threshold level, configuring the configurable BB filter with a first bandwidth; and in response to no jammer signal being detected with a signal strength above a threshold level, configuring the configurable BB filter with a second bandwidth higher than the first bandwidth.

In a twenty-third aspect, in combination with the fourteenth aspect through the twenty-second aspect, configuring the configurable BB filter comprises configuring at least one switch of a feedback loop of an operational amplifier of a plurality of operational amplifiers coupled in series, each operational amplifier of the plurality of operational amplifiers coupled at an input and an output to a corresponding configurable feedback loop.

In a twenty-fourth aspect, in combination with the fourteenth aspect through the twenty-third aspect, configuring the configurable BB filter comprises enabling or disabling at least one slice of at least one operational amplifier of the plurality of operational amplifiers.

In a twenty-fifth aspect, in combination with the fourteenth aspect through the twenty-fourth aspect, the method further includes high-pass filtering an output of a mixer prior to filtering the BB input signal in the configurable BB filter.

In a twenty-sixth aspect, in combination with the fourteenth aspect through the twenty-fifth aspect, high-pass filtering the output of the mixer comprises high-pass filtering with a bank of capacitors.

In one or more aspects, techniques for supporting wireless communications may be performed by an apparatus. The apparatus may include, according to a twenty-seventh aspect, an input port for receiving a baseband (BB) input signal; a configurable BB filter coupled to the input port comprising means for reconfiguring the BB filter; and means for controlling the configurable BB filter coupled to the configurable BB filter by evaluating one or more criteria relating to the BB input signal and configuring the configurable BB filter based, at least in part, on the evaluation of the one or more criteria. Additionally, the device may perform or operate according to one or more aspects as described below. In some implementations, the device includes a wireless device, such as a base station (BS) or user equipment (UE). In some implementations, the device may include at least one processor, and a memory coupled to the processor, wherein the processor may be configured to perform operations described herein with respect to the device. In some other implementations, the device may include a non-transitory computer-readable medium having program code recorded thereon and the program code may be executable by the device for causing the device to perform operations described herein with reference to the device. In some implementations, the device may include one or more means configured to perform operations described herein.

In a twenty-eighth aspect, in combination with the twenty-seventh aspect, the means for reconfiguring the BB filter comprises means for coupling and decoupling elements of the configurable BB filter to adjust a bandwidth of the configurable BB filter.

In a twenty-ninth aspect, in combination with one or more of the twenty-seventh through the twenty-eighth aspects, the means for reconfiguring the BB filter comprises means for coupling and decoupling elements of the configurable BB filter to adjust a filter order of the configurable BB filter.

In a thirtieth aspect, in combination with one or more of the twenty-seventh through the twenty-ninth aspect, the apparatus further includes means for converting an analog signal to a digital signal coupled to the configurable BB filter.

In a thirty-first aspect, in combination with one or more of the twenty-seventh aspect through the thirtieth aspect, the means for controlling the configurable BB filter comprises means for selecting one of a plurality of means for converting an analog signal to a digital signal.

In a thirty-second aspect, in combination with one or more of the twenty-seventh aspect through the thirty-first aspect, the means for controlling the configurable BB filter comprises means for determining a presence of a jammer signal and configuring the configurable BB filter based, at least in part, on a determination of the presence of the jammer signal.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Components, the functional blocks, and the modules described herein with respect to FIG. 11 and FIG. 12 include some or all of processors, electronics devices, hardware devices, electronics components, logical circuits, memories, software codes, firmware codes, among other examples, or any combination thereof. In addition, features discussed herein may be implemented via specialized processor circuitry, via executable instructions, or combinations thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Skilled artisans will also readily recognize that the order or combination of components, methods, or interactions that are described herein are merely examples and that the components, methods, or interactions of the various aspects of the present disclosure may be combined or performed in ways other than those illustrated and described herein.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, or, any conventional processor, controller, microcontroller, or state machine. In some implementations, a processor may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, that is one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that may be enabled to transfer a computer program from one place to another. A storage media may be any available media that may be accessed by a computer. By way of example, and not limitation, such computer-readable media may include random-access memory (RAM), read-only memory (ROM), electrically erasable programmable read-only memory (EEPROM), CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to some other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, some other implementations are within the scope of the following claims. In some cases, the actions recited in the claims may be performed in a different order and still achieve desirable results.

As used herein, including in the claims, the term "or," when used in a list of two or more items, means that any one of the listed items may be employed by itself, or any combination of two or more of the listed items may be employed. For example, if an apparatus is described as containing components A, B, or C, the apparatus may contain A alone; B alone; C alone; A and B in combination; A and C in combination; B and C in combination; or A, B, and C in combination. Also, as used herein, including in the claims, "or" as used in a list of items prefaced by "at least one of" indicates a disjunctive list such that, for example, a list of "at least one of A, B, or C" means A or B or C or AB or AC or BC or ABC (that is A and B and C) or any of these in any combination thereof. The term "substantially" is defined as largely but not necessarily wholly what is specified (and includes what is specified; for example, substantially 90 degrees includes 90 degrees and substantially parallel includes parallel), as understood by a person of ordinary skill in the art. In any disclosed implementations, the term "substantially" may be substituted with "within [a percentage] of" what is specified, where the percentage includes .1, 1, 5, or 10 percent.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus, comprising:
    an input port for receiving a baseband (BB) input signal;
    a configurable BB filter coupled to the input port;
    logic circuitry coupled to the configurable BB filter, wherein the logic circuitry is configured to perform steps comprising:
    evaluating one or more criteria relating to the BB input signal; and
    configuring the configurable BB filter based, at least in part, on the evaluating of the one or more criteria; and
    wherein the configurable BB filter comprises:
    a plurality of configurable operational amplifiers coupled in series to form a reconfigurable receiver chain.

2. The apparatus of claim 1, wherein configuring the configurable BB filter comprises configuring a filter order and a filter bandwidth of the configurable BB filter based, at least in part, on the evaluating of the one or more criteria.

3. The apparatus of claim 1, wherein evaluating the one or more criteria comprises:
    determining whether a first analog-to-digital converter (ADC) of a plurality of ADCs is coupled to the configurable BB filter; and
    determining whether a second analog-to-digital converter (ADC) of the plurality of ADCs is coupled to the configurable BB filter.

4. The apparatus of claim 3, wherein:
    determining whether the first analog-to-digital converter (ADC) of the plurality of ADCs is coupled to the configurable BB filter comprises determining whether a sigma-delta ADC (SD-ADC) is coupled to the configurable BB filter; and
    determining whether the second analog-to-digital converter (ADC) of the plurality of ADCs is coupled to the configurable BB filter comprises determining whether a successive-approximation-register ADC (SAR-ADC) is coupled to the configurable BB filter.

5. The apparatus of claim 4, wherein configuring the configurable BB filter comprises:
configuring the configurable BB filter as a second-order filter when the SD-ADC is determined to be coupled to the configurable BB filter; and
configuring the configurable BB filter as a third-order filter when the SAR-ADC is determined to be coupled to the configurable BB filter.

6. The apparatus of claim 4, wherein configuring the configurable BB filter comprises:
configuring the configurable BB filter with a first bandwidth when the SD-ADC is determined to be coupled to the configurable BB filter; and
configuring the configurable BB filter with a second bandwidth higher than the first bandwidth when the SAR-ADC is determined to be coupled to the configurable BB filter.

7. The apparatus of claim 3, wherein evaluating the one or more criteria comprises:
determining whether the first ADC is coupled to the configurable BB filter by determining the BB input signal is based on a 5G sub-7 GHz RF signal; and
determining whether the second ADC is coupled to the configurable BB filter by determining the BB input signal is based on a 5G mmWave RF signal.

8. The apparatus of claim 1, wherein evaluating the one or more criteria comprises detecting one or more jammer signals.

9. The apparatus of claim 8, wherein the logic circuitry is configured to perform steps comprising:
in response to a jammer signal being detected with a signal strength above a threshold level, configuring the configurable BB filter with a first bandwidth; and
in response to no jammer signal being detected with a signal strength above a threshold level, configuring the configurable BB filter with a second bandwidth higher than the first bandwidth.

10. The apparatus of claim 1, wherein the plurality of configurable operational amplifiers comprises:
a plurality of configurable feedback loops coupled at an input and an output to a corresponding configurable operational amplifier of the plurality of configurable operational amplifiers.

11. The apparatus of claim 10, wherein at least one of the plurality of configurable operational amplifiers comprises a transistor with a gate configured to be coupled to or disconnected from a cascode bias.

12. The apparatus of claim 1, wherein at least one configurable operational amplifier of the plurality of configurable operational amplifiers comprises at least two slices, wherein at least one of the at least two slices can be controlled independently from others of the at least two slices.

13. The apparatus of claim 1, further comprising:
a mixer; and
a capacitor bank coupled to the mixer and to the input port, wherein the capacitor bank comprises:
a first plurality of capacitors, each of the first plurality of capacitors coupled to a first output of the mixer and at least two switches comprising a first switch coupling one of the first plurality of capacitors to a second output of the mixer and a second switch coupling the one of the first plurality of capacitors to the first output of the mixer; and
a second plurality of capacitors, each of the second plurality of capacitors coupled to the second output of the mixer and at least two switches comprising a first switch coupling one of the second plurality of capacitors to the first output of the mixer and a second switch coupling the one of the second plurality of capacitors to the second output of the mixer.

14. A method, comprising:
evaluating one or more criteria relating to a BB input signal to a configurable BB filter; and
configuring the configurable BB filter based, at least in part, on evaluating the one or more criteria, wherein the configuring comprises configuring a plurality of configurable operational amplifiers of the configurable BB filter.

15. The method of claim 14, wherein configuring the configurable BB filter comprises configuring a filter order and a filter bandwidth of the configurable BB filter based, at least in part, on the evaluating of the one or more criteria.

16. The method of claim 14, wherein evaluating the one or more criteria comprises:
determining whether a first analog-to-digital converter (ADC) of a plurality of ADCs is coupled to the configurable BB filter; and
determining whether a second analog-to-digital converter (ADC) of the plurality of ADCs is coupled to the configurable BB filter.

17. The method of claim 16, wherein evaluating the one or more criteria comprises:
determining whether the first ADC is coupled to the configurable BB filter by determining the BB input signal is based on a 5G sub-7 GHz RF signal; and
determining whether the second ADC is coupled to the configurable BB filter by determining the BB input signal is based on a 5G mmWave RF signal.

18. The method of claim 16, wherein:
determining whether a first analog-to-digital converter (ADC) of a plurality of ADCs is coupled to the configurable BB filter comprises determining whether a sigma-delta ADC (SD-ADC) is coupled to the configurable BB filter; and
determining whether a second analog-to-digital converter (ADC) of the plurality of ADCs is coupled to the configurable BB filter comprises determining whether a successive-approximation-register ADC (SAR-ADC) is coupled to the configurable BB filter.

19. The method of claim 18, wherein configuring the configurable BB filter comprises:
configuring the configurable BB filter as a second-order filter when the SD-ADC is determined to be coupled to the configurable BB filter; and
configuring the configurable BB filter as a third-order filter when the SAR-ADC is determined to be coupled to the configurable BB filter.

20. The method of claim 18, wherein configuring the configurable BB filter comprises:
configuring the configurable BB filter with a first bandwidth when the SD-ADC is determined to be coupled to the configurable BB filter; and
configuring the configurable BB filter with a second bandwidth higher than the first bandwidth when the SAR-ADC is determined to be coupled to the configurable BB filter.

21. The method of claim 14, wherein evaluating the one or more criteria comprises detecting one or more jammer signals.

22. The method of claim 21, wherein:
in response to a jammer signal being detected with a signal strength above a threshold level, configuring the configurable BB filter with a first bandwidth; and in response to no jammer signal being detected with a signal strength above a threshold level, configuring the configurable BB filter with a second bandwidth higher than the first bandwidth.

23. The method of claim 14, wherein configuring the configurable BB filter comprises:
configuring at least one switch of a feedback loop of a configurable operational amplifier of the plurality of configurable operational amplifiers.

24. The method of claim 23, wherein configuring the configurable BB filter comprises:
enabling or disabling at least one slice of at least one configurable operational amplifier of the plurality of configurable operational amplifiers.

25. The method of claim 14, further comprising high-pass filtering an output of a mixer prior to filtering the BB input signal in the configurable BB filter.

26. The method of claim 25, wherein high-pass filtering the output of the mixer comprises high-pass filtering with a bank of capacitors.

27. An apparatus, comprising:
an input port for receiving a baseband (BB) input signal;
a configurable BB filter comprising a plurality of configurable operational amplifiers coupled in series to form a reconfigurable receiver chain, wherein the configurable BB filter is coupled to the input port comprising means for reconfiguring the BB filter; and
means for controlling the configurable BB filter coupled to the configurable BB filter by evaluating one or more criteria relating to the BB input signal and configuring the configurable BB filter based, at least in part, on the evaluation of the one or more criteria.

28. The apparatus of claim 27, wherein the means for reconfiguring the BB filter comprises means for coupling and decoupling elements in a feedback path around at least one of the configurable operational amplifiers of the configurable BB filter to adjust a bandwidth of the configurable BB filter.

29. The apparatus of claim 27, wherein the means for reconfiguring the BB filter comprises means for coupling and decoupling elements in a feedback path around at least one of the configurable operational amplifiers of the configurable BB filter to adjust a filter order of the configurable BB filter.

30. The apparatus of claim 27, further comprising means for converting an analog signal to a digital signal coupled to the configurable BB filter.

31. The apparatus of claim 30, wherein the means for controlling the configurable BB filter comprises means for selecting one of a plurality of means for converting an analog signal to a digital signal.

32. The apparatus of claim 27, wherein the means for controlling the configurable BB filter comprises:
means for determining a presence of a jammer signal and configuring the configurable BB filter based, at least in part, on a determination of the presence of the jammer signal.

* * * * *